United States Patent
Zhou et al.

(10) Patent No.: US 10,056,301 B2
(45) Date of Patent: Aug. 21, 2018

(54) TRANSISTOR AND FABRICATION METHOD THEREOF

(71) Applicant: Semiconductor Manufacturing International (Shanghai) Corporation, Shanghai (CN)

(72) Inventors: Fei Zhou, Shanghai (CN); Yong Li, Shanghai (CN); Jianhua Ju, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 29 days.

(21) Appl. No.: 15/187,578

(22) Filed: Jun. 20, 2016

(65) Prior Publication Data

US 2017/0365527 A1 Dec. 21, 2017

(51) Int. Cl.
| | |
|---|---|
| *H01L 29/66* | (2006.01) |
| *H01L 21/8238* | (2006.01) |
| *H01L 21/265* | (2006.01) |
| *H01L 21/28* | (2006.01) |
| *H01L 29/49* | (2006.01) |
| *H01L 27/092* | (2006.01) |
| *H01L 29/78* | (2006.01) |
| *H01L 27/11* | (2006.01) |

(52) U.S. Cl.
CPC .... *H01L 21/823842* (2013.01); *H01L 21/265* (2013.01); *H01L 21/28088* (2013.01); *H01L 21/28097* (2013.01); *H01L 21/823821* (2013.01); *H01L 27/0924* (2013.01); *H01L 27/1104* (2013.01); *H01L 29/4966* (2013.01); *H01L 29/4975* (2013.01); *H01L 29/66795* (2013.01); *H01L 29/7851* (2013.01)

(58) Field of Classification Search
CPC ......... H01L 21/823842; H01L 29/4966; H01L 27/0924; H01L 21/28088; H01L 27/1104; H01L 21/265; H01L 29/7851; H01L 29/66795; H01L 29/4975
See application file for complete search history.

(56) References Cited

U.S. PATENT DOCUMENTS

| | | | |
|---|---|---|---|
| 8,466,496 B2* | 6/2013 | Yu | H01L 21/823871 257/199 |
| 9,099,338 B2* | 8/2015 | Han | H01L 27/092 |
| 2012/0228718 A1* | 9/2012 | Lin | H01L 21/823807 257/379 |
| 2012/0329261 A1* | 12/2012 | Wang | H01L 21/265 438/589 |
| 2013/0299914 A1* | 11/2013 | Kim | H01L 27/092 257/369 |

* cited by examiner

*Primary Examiner* — Thomas L Dickey
(74) *Attorney, Agent, or Firm* — Anova Law Group, PLLC

(57) ABSTRACT

A method for forming a transistor is provided. The method includes providing a semiconductor substrate, and forming a dielectric layer on the semiconductor substrate. The dielectric layer has a gate structure recess. The method also includes forming a work function layer on a bottom and sidewalls of the gate structure recess; performing an ion implantation on the work function layer; and forming a gate layer on the work function layer after the ion implantation.

20 Claims, 26 Drawing Sheets

TRANSISTOR AND FABRICATION METHOD THEREOF

FIELD OF THE INVENTION

The present invention generally relates to the field of semiconductor manufacturing technology and, more particularly, relates to transistor, semiconductor structure, and fabrication processes thereof.

BACKGROUND

SRAM (Static Random Access Memory), as one type of memory, has the advantages of high speed, low power, and being compatible with standard processes, etc., and is widely used in PCs, personal communication devices, consumer electronics (e.g., smart cards, digital cameras, multimedia players), and other fields.

A static random access memory comprises a plurality of static random access memory cells (hereinafter referred to as SRAM cells). The plurality of SRAM cells are arranged in an array. One SRAM cell typically comprises six transistors (6-T) electrically connected with each other, including two pull-up transistors, two pull-down transistors, and two transfer transistors. Among them, the pull-up transistors are PMOS transistors, the pull-down transistors and the transfer transistors are NMOS transistors.

Current SRAM cell fabrication techniques often use a semiconductor structure having a P-type FinFET and an N-type FinFET with corresponding gates connected. However, such semiconductor structure may still have performance issues. The disclosed device structures and methods are directed to solve one or more problems set forth above and other problems.

BRIEF SUMMARY OF THE DISCLOSURE

One aspect of the present disclosure includes a method for forming a transistor. The method includes providing a semiconductor substrate, and forming a dielectric layer on the semiconductor substrate. The dielectric layer has a gate structure recess. The method also includes forming a work function layer on a bottom and sidewalls of the gate structure recess; performing an ion implantation on the work function layer; and forming a gate layer on the work function layer after the ion implantation.

Another aspect of the present disclosure includes a transistor. The transistor includes a semiconductor substrate and a dielectric layer formed on the semiconductor substrate. The dielectric layer has a gate structure recess. The transistor also includes a work function layer formed on a bottom and sidewalls of the gate structure recess, and a gate layer formed on the work function layer. The work function layer is doped with ions by an ion implantation.

Another aspect of the present disclosure includes method of forming a semiconductor structure. The method includes providing a semiconductor substrate, the semiconductor substrate having a PMOS region and an NMOS region; forming a first dielectric layer on the semiconductor substrate in the PMOS region, the first dielectric layer having a first gate structure recess; forming a second dielectric layer on the semiconductor substrate in the NMOS region, the second dielectric layer having a second gate structure recess; forming a PMOS work function layer on a bottom and the sidewalls of the first gate structure recess; forming an NMOS work function layer on a bottom and the sidewalls of the second gate structure recess; performing a first ion implantation on the PMOS work function layer and a second ion implantation on the NMOS work function layer; forming a first gate layer on the PMOS work function layer after the first ion implantation; and forming a second gate layer is formed on the NMOS work function layer after the second ion implantation.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1 to 21 show a method for forming a semiconductor structure in an SRAM cell. The semiconductor structure includes a P-type FinFET and an N-type FinFET with connected gates.

Figure 1:
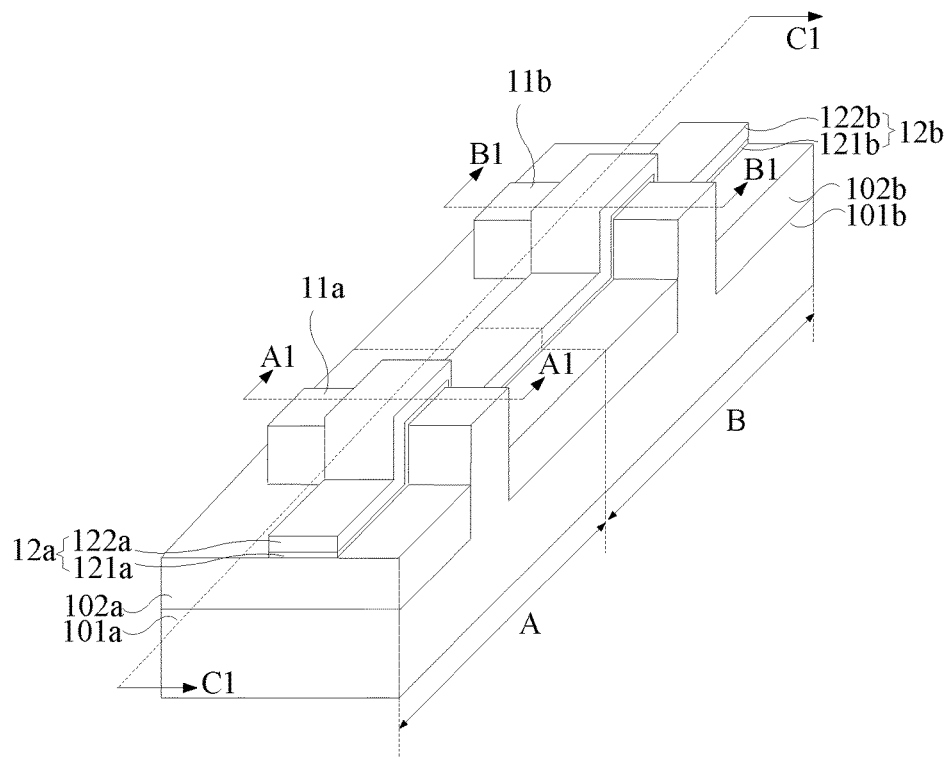
FIG. 1 is a schematic view of a semiconductor substrate with a PMOS region and an NMOS region, and a first polysilicon gate structure and a second polysilicon gate structure.
Figure 2:
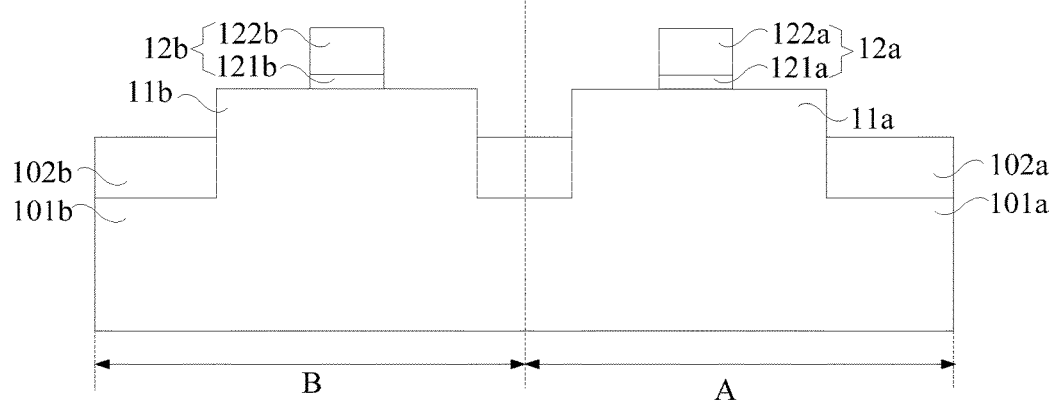
FIG. 2 is cross-sectional view along the direction of A1A1 and B1B1 in FIG. 1.
Figure 3:
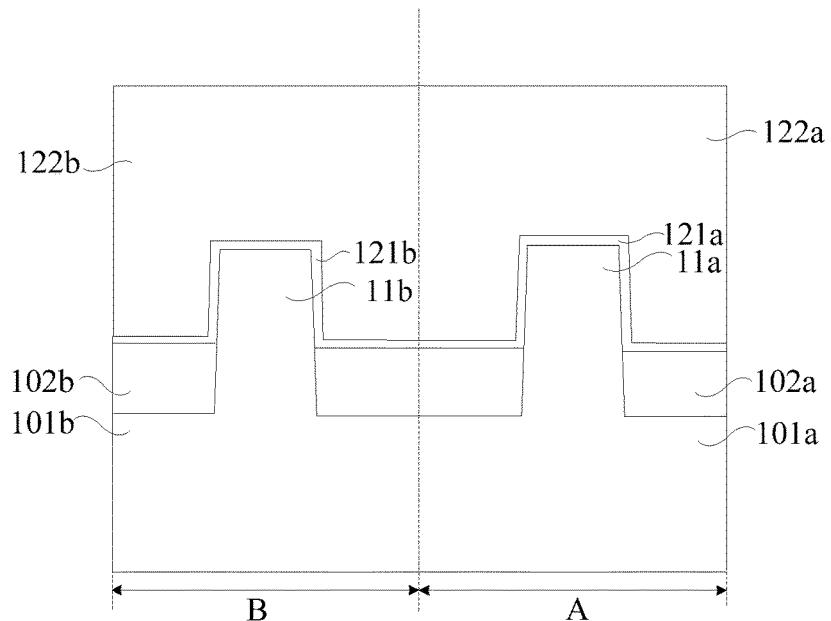
FIG. 3 is a cross-sectional view along the direction C1C1 in FIG. 1.

Referring to FIGS. 1 to 3, a semiconductor substrate is provided. The substrate comprises a PMOS region A and an NMOS region B. The PMOS region and the NMOS region B are adjacent to each other, the PMOS region A is used for forming the P-type FinFET, and the NMOS region B is used for forming the N-type FinFET. The PMOS region A has a first fin portion 11a, and the NMOS region B has a second fin portion 11b.

The semiconductor substrate in the PMOS region A has a silicon substrate 101a with at least two discrete protrusions and an insulating layer 102a between the protrusions. The insulating layer 102a is lower than the protrusions, and the part of the protrusion higher than the insulating layer 102a is the first fin portion 11a.

The semiconductor substrate in the NMOS region B has a silicon substrate 101b with at least two discrete protrusions and an insulating layer 102b between the protrusions. The insulating layer 102b is lower than the protrusions, and the part of the protrusion higher than the insulating layer 102b is the second fin portion 11b.

Next, a first polysilicon gate structure 12a is formed across the first fin portion 11a. The first polysilicon gate structure 12a includes a first gate oxide layer 121a and a polysilicon gate layer 122a located on the first gate oxide layer 121a. The first gate oxide layer 121a is made of silicon oxide.

The second polysilicon gate structure 12b is formed across the second fin portion 11b. The second polysilicon gate structure 12b includes a second gate oxide layer 121b and a polysilicon gate layer 122b located on the second gate oxide layer 121b. The second gate oxide layer 121a is made of silicon oxide.

Figure 4:
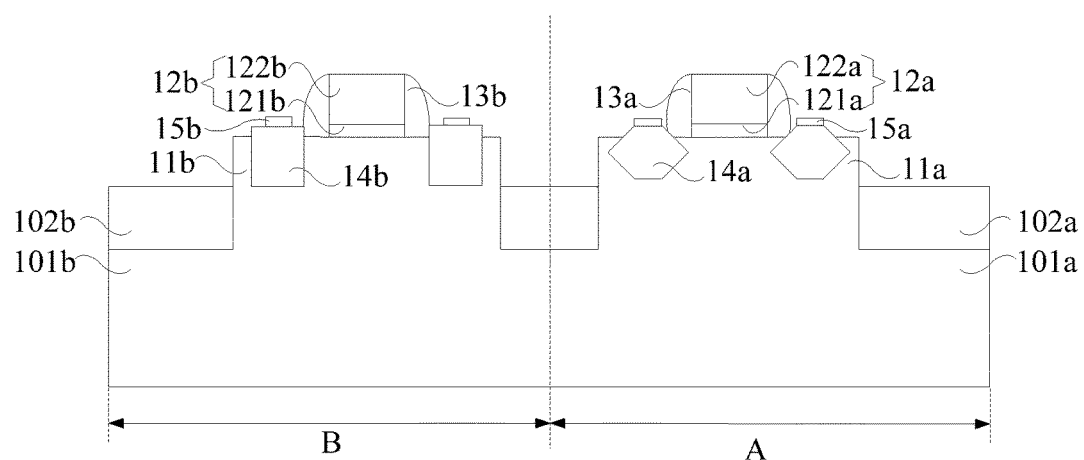
FIG. 4, FIG. 6, FIG. 8, FIG. 10, FIG. 12, FIG. 14, FIG. 16, FIG. 18 and FIG. 20 are cross-sectional views along A1A1 direction and B1B1 direction of semiconductor structures corresponding to certain stages of a fabrication process following FIG. 2.
Figure 5:
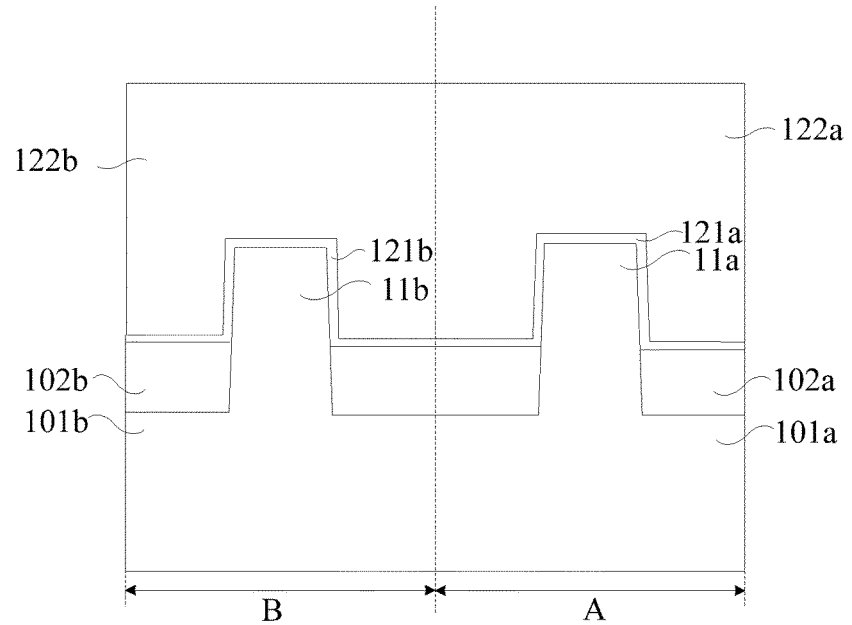
FIG. 5, FIG. 7, FIG. 9, FIG. 11, FIG. 13, FIG. 15, FIG. 17, FIG. 19 and FIG. 21 are cross-sectional views along C1C1 direction of semiconductor structures corresponding to certain stages of a fabrication process following FIG. 3, corresponding to FIG. 4, FIG. 6, FIG. 8, FIG. 10, FIG. 12, FIG. 14, FIG. 16, FIG. 18 and FIG. 20.

Further, referring to FIG. 4 and FIG. 5, a first sidewall spacer 13a is formed around the first polysilicon gate structure 12a, and a second sidewall spacer 13b is formed around the second polysilicon gate structure 12b.

Further, referring to FIG. 4, a first source and first drain 14a is formed within the first fin portion 11a on both sides of the first sidewall spacer 13a, and a first metal silicide layer 15a is formed on the first source and first drain 14a. A second source and second drain 14b is formed within the second fin portion 11b on both sides of the second sidewall spacer 13b, and a second metal silicide layer 15b is formed on the second source and second drain 14b.

Figure 6:
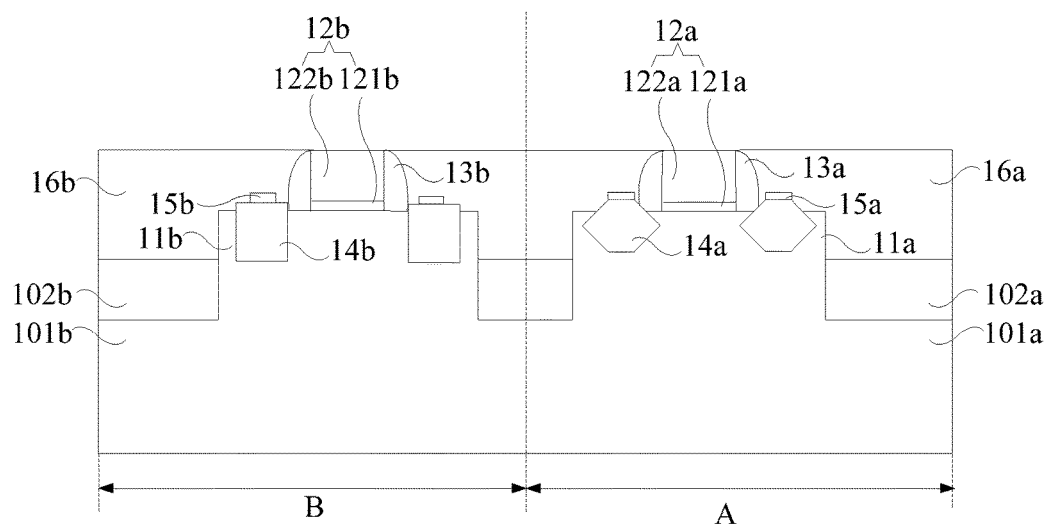
Figure 7:
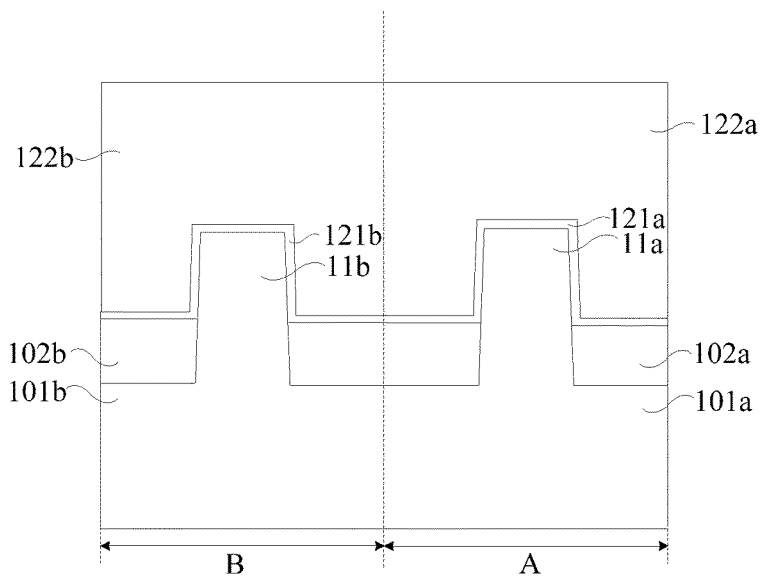

Further, referring to FIG. 6 and FIG. 7, a first dielectric layer 16a is formed on the semiconductor substrate in the PMOS region A, the first metal silicide 15a, the first polysilicon gate structure 12a, and the first sidewall spacer 13a. The first dielectric layer 16a is flush with the first polysilicon gate structure 12a. A second dielectric layer 16b is formed on the semiconductor substrate in the NMOS region B, the second metal silicide 15b, the second polysilicon gate structure 12b, and the second sidewall spacer 13b. The second dielectric layer 16b is flush with the second polysilicon gate structure 12b.

Figure 8:
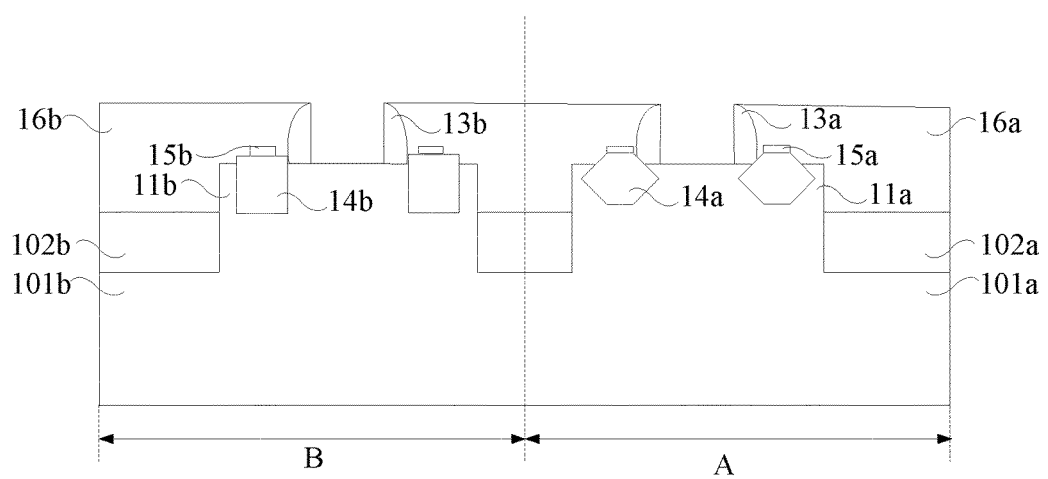
Figure 9:
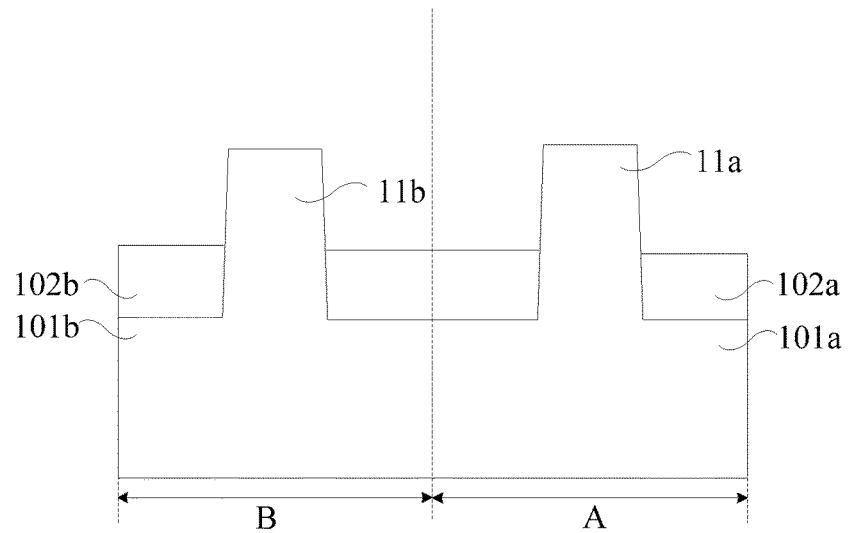

Referring to FIGS. 8 and 9, the first polysilicon gate structure 12a is removed, and a first gate structure recess is formed in the first dielectric layer 16a. The first fin portion 11a is exposed at the bottom of the first gate structure recess. The second polysilicon gate structure 12b is also removed, and a second gate structure recess is formed in the second dielectric layer 16b. The second fin portion 11b is exposed at the bottom of the second gate structure recess.

Figure 10:
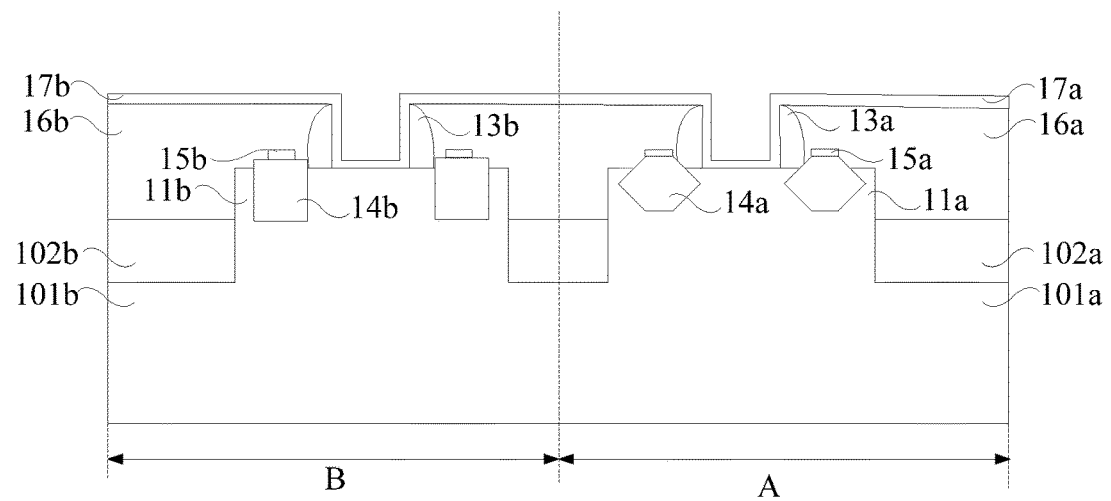
Figure 11:
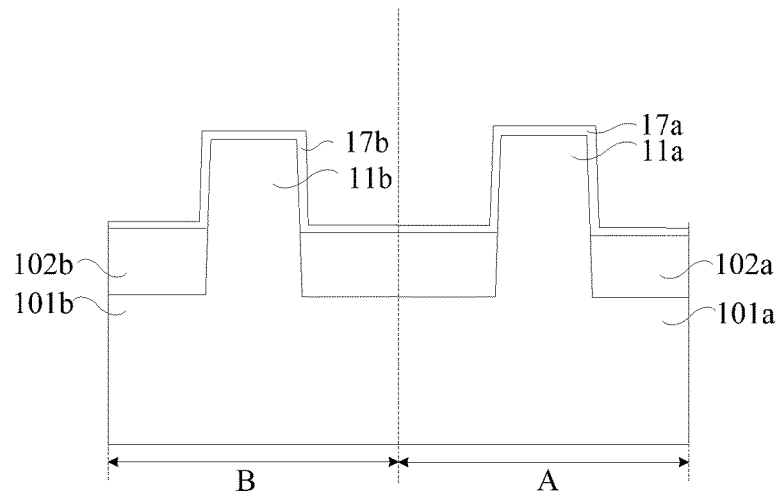

Further, referring to FIG. 10 and FIG. 11, a first stack structure 17a is formed by the first dielectric layer 16a, and the bottom and sidewalls of the first gate structure recess. The first stack structure 17a includes a first interface layer (not shown), and a first high-k gate dielectric layer (not shown) on the first interface layer. The first interface layer is made of silicon oxide.

A second stack structure 17b is formed by the second dielectric layer 16b, and the bottom and sidewalls of the second gate structure recess. The second stack structure 17b includes a second interface layer (not shown), and a second high-k gate dielectric layer (not shown) on the second interface layer. The second interface layer is made of silicon oxide.

Figure 12:
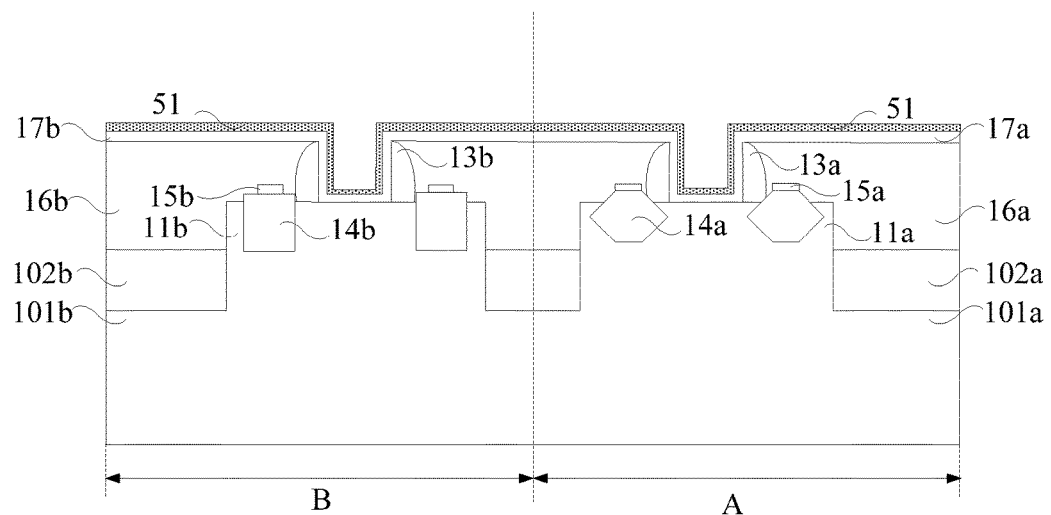
Figure 13:
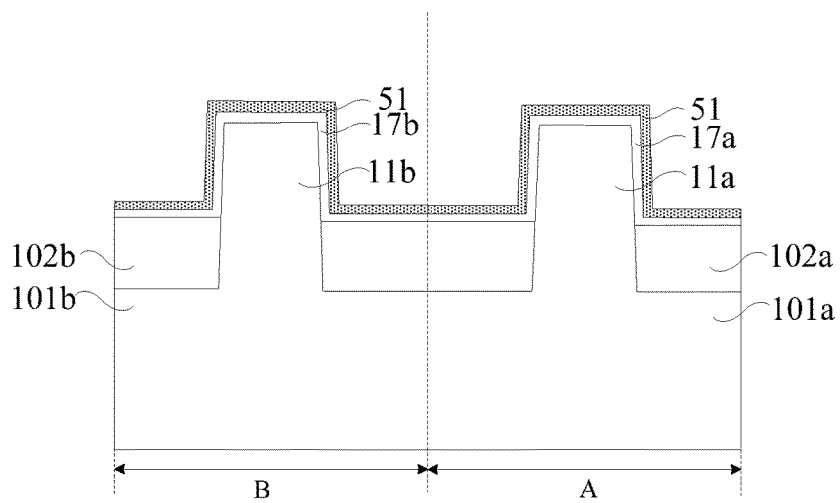

Referring to FIGS. 12 and 13, a first work function material layer 51 is formed on the first stack structure 17a and the second stack structure 17b.

Figure 14:
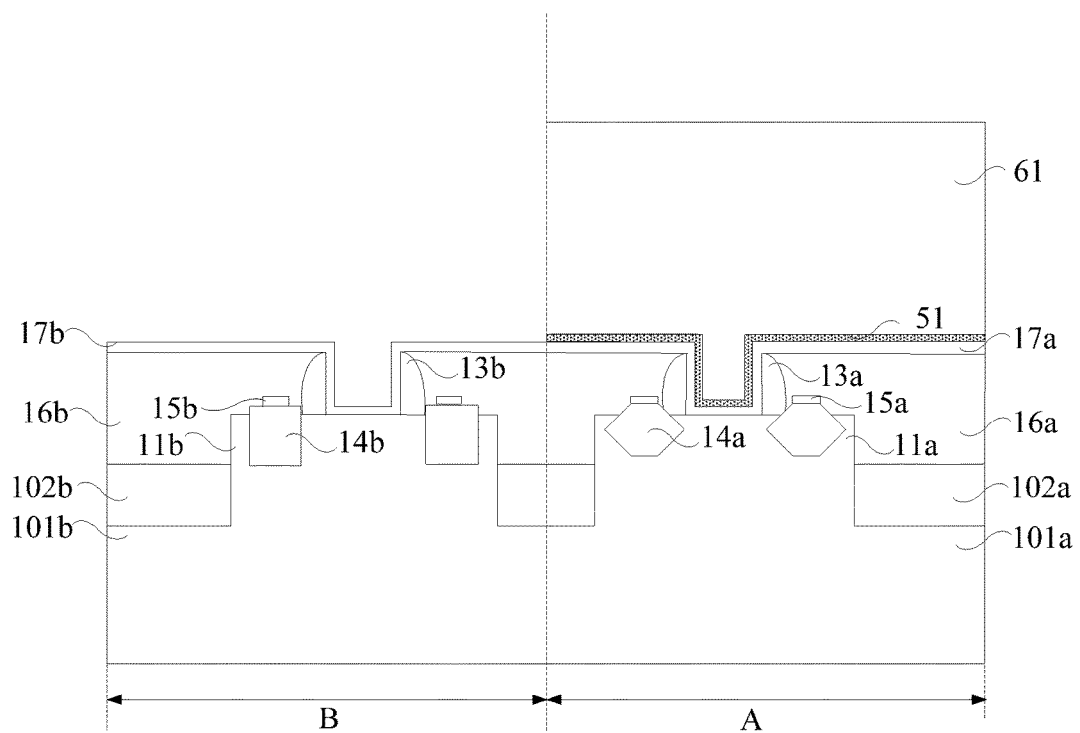
Figure 15:
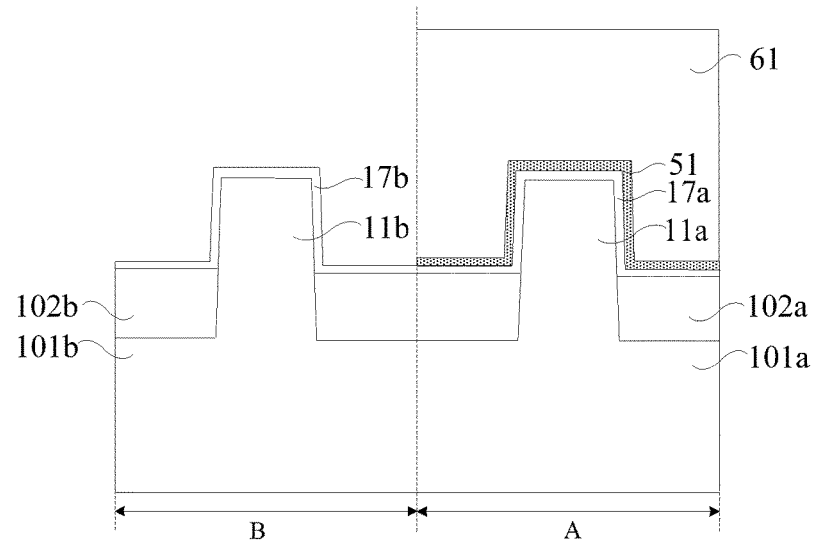

Further, referring to FIG. 14 and FIG. 15, a patterned mask layer 61 is formed on the first work function material layer 51 in the PMOS region A. The patterned mask layer 61 exposes the first NMOS work function material region B layer 51. Using the patterned mask layer as a mask, the first work function material layer 51 in the NMOS region B is removed.

Figure 16:
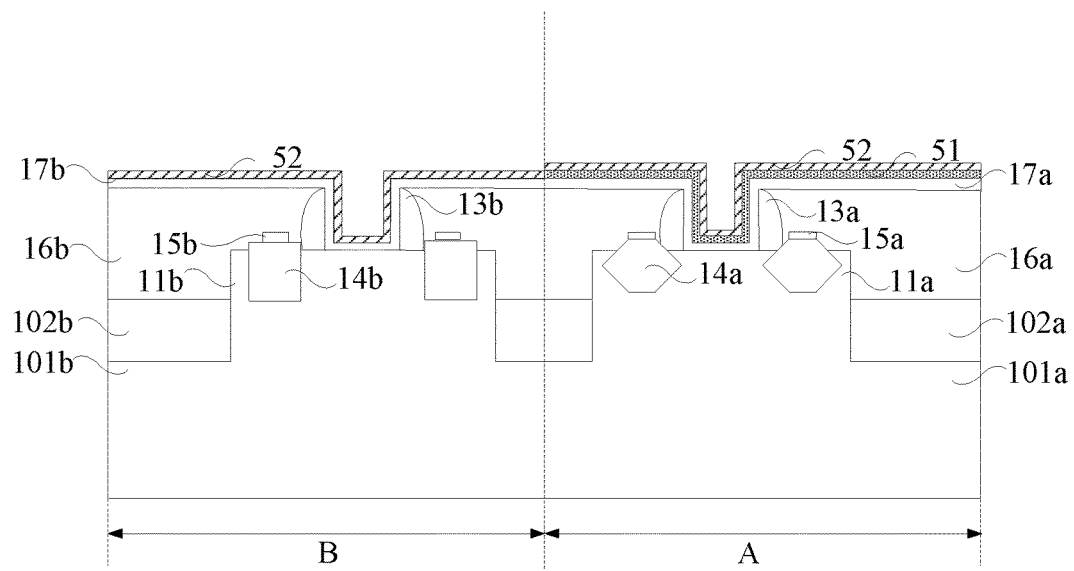
Figure 17:
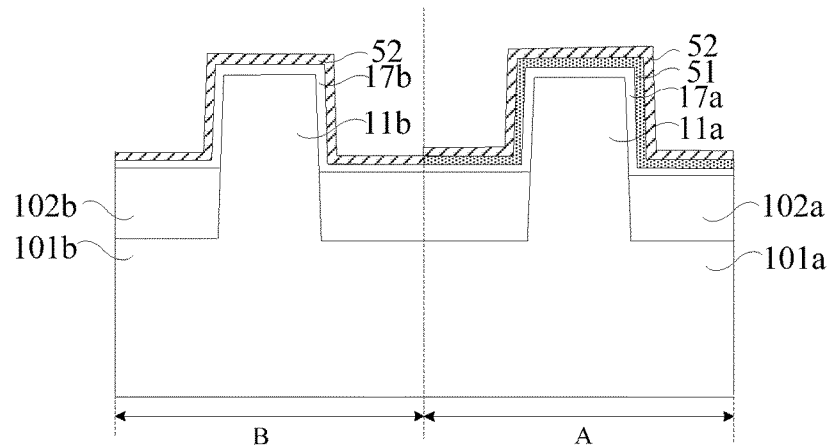

Referring to FIG. 16 and FIG. 17, a second work function material layer 52 is formed on the second stack structure 17b, and the first work function material layer 51 in the PMOS region A. The first work function material layer 51 is made of TiN, and the second work function material layer 52 is made of TiAl.

Figure 18:
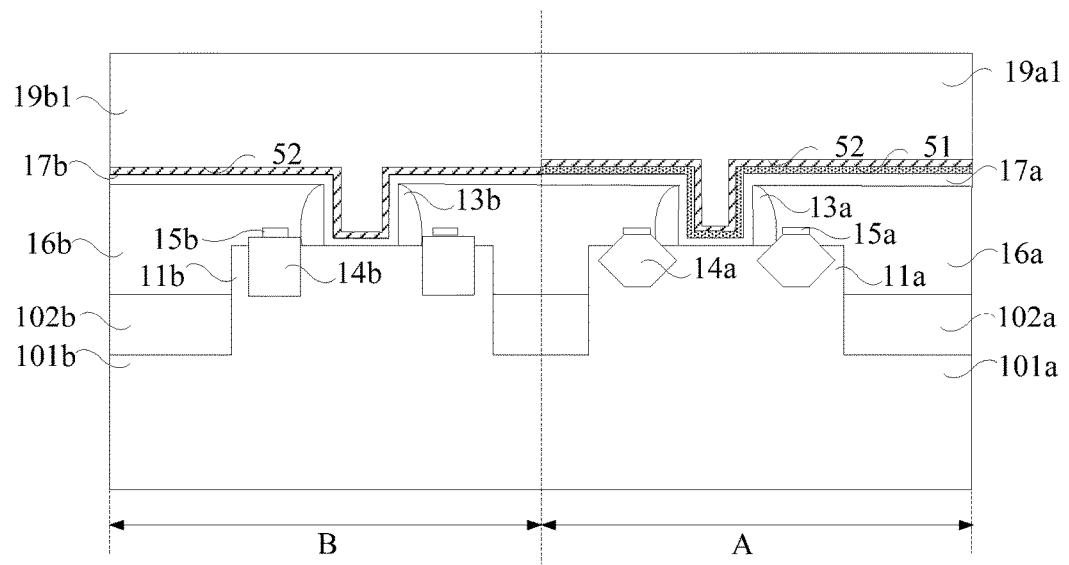
Figure 19:
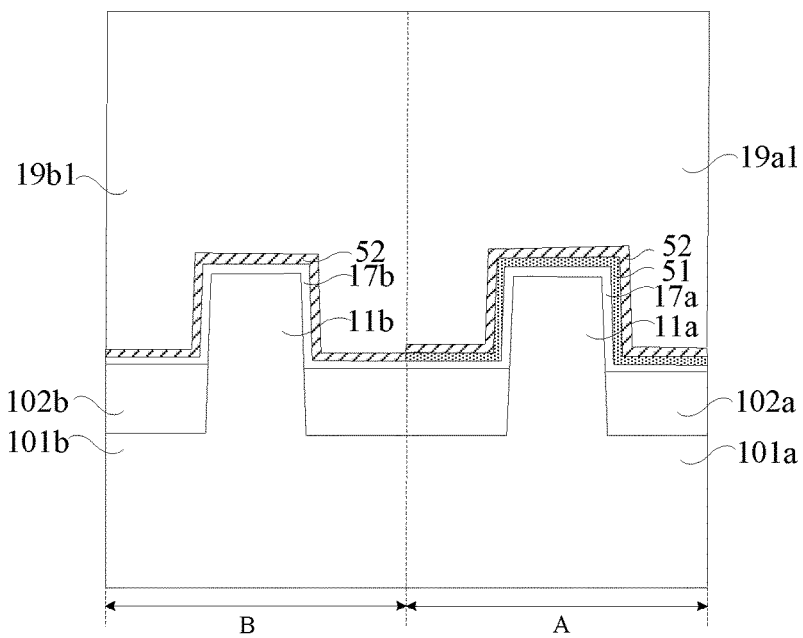

Referring to FIG. 18 and FIG. 19, a first aluminum layer 19a1 is formed on the second work function material layer 52 in the PMOS region A. The portion of the first stack structure 17a, first work function material layer 51, second work function material layer 52, and first aluminum layer 19a1 that are higher than the first dielectric layer 16a is removed. The remaining first aluminum layer 19a1 is the first aluminum gate layer 19a, forming the first aluminum gate structure together with the remaining first work function material layer 51, second work function material layer 52, and first stack structure 17a. The remaining first work function material layer 51 and the remaining second work function material layer 52 were stacked to form the PMOS work function layer.

A second aluminum layer 19b1 is formed on the second work function material layer 52 in the NMOS region B. The portion of the second stack structure 17b, second work function material layer 52, and second aluminum layer 19b1 that are higher than the second dielectric layer 16b is removed. The remaining second aluminum layer 19b1 is the second aluminum gate layer 19b, forming the second aluminum gate structure together with the remaining second work function material layer 52, and second stack structure 17b. The remaining second work function material layer 52 forms the NMOS work function layer.

Figure 20:
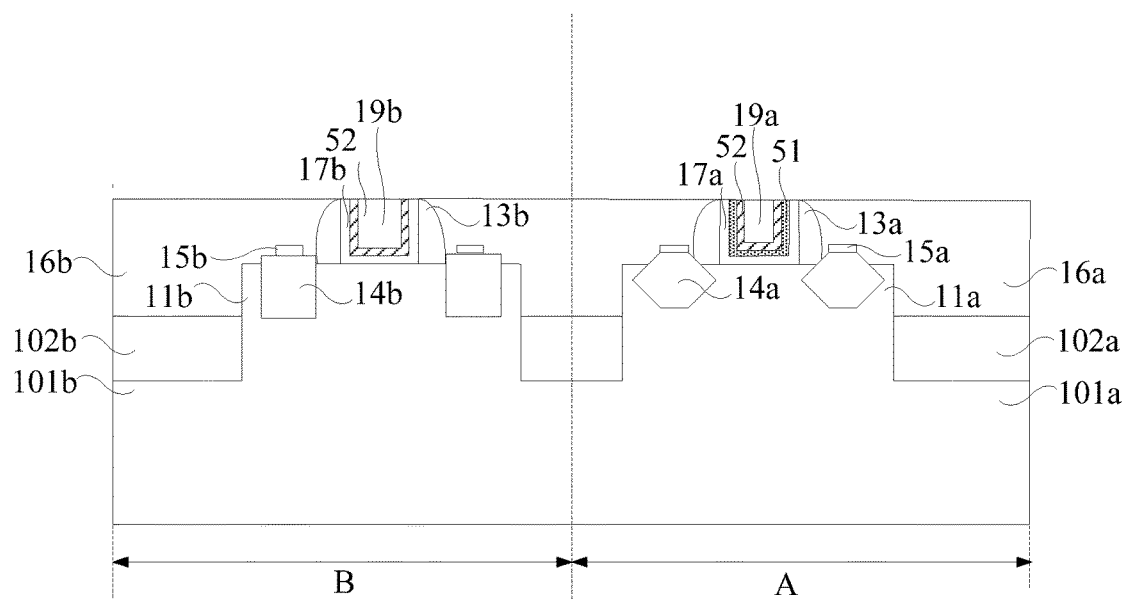
Figure 21:
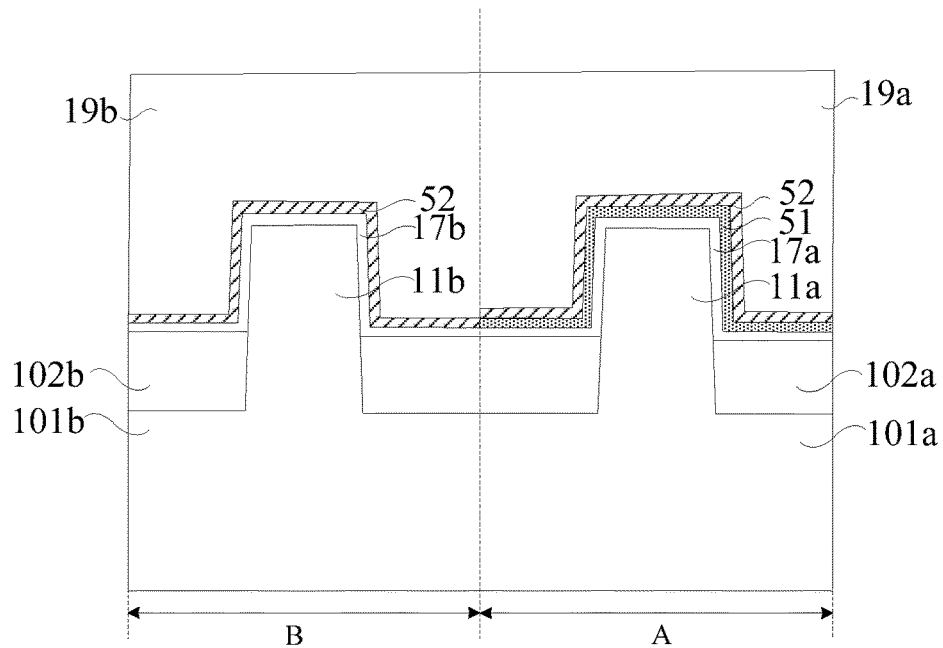

Thus, referring to FIG. 1, FIG. 20 and FIG. 21, the PMOS work function layer is the stacked first work function material layer 51 and second work function material layer 52. The NMOS work function layer is the second work function material layer 52. The first work function material layer 51 is made of TiN, and the second work function material layer 52 is made of TiAl.

Because the second work function material layer 52 in the PMOS work function layer is adjacent to the first work function material layer 51, the aluminum ions in the second work function material layer 52 of the PMOS work function layer can continuously diffuse into the first work function material layer 51 of the PMOS work function layer. Further, referring to FIG. 21, the NMOS work function layer is adjacent to and the PMOS work function layer, the aluminum ions in the NMOS work function layer can also continuously diffuse into the first work function material layer 51 of the PMOS work function layer.

Thus, the amount of aluminum ions in the first work function material layer 51 of the PMOS work function layer may continuously change. The original properties of the first work function material layer 51 may be changed and unstable. The PMOS threshold voltage of the subsequently formed P-type FinFET may be fluctuating, and it may be difficult for the PMOS threshold voltage to be stabilized at the target PMOS threshold voltage value, and for the total threshold voltage of the subsequently formed semiconductor structure to be stabilized at the target total threshold voltage value.

Further, the aluminum ions in the first aluminum gate layer 19a in the PMOS region A can continuously diffuse into the first work function material layer 51 of the PMOS work function layer, further causing the amount of aluminum ions in the first work function material layer 51 unstable. The difficulty for the total threshold voltage of the subsequently formed semiconductor structure to be stabilized at the target total threshold voltage value is further increased.

Further, the aluminum ions in the first aluminum gate layer 19a in the PMOS region A can continuously diffuse into the second work function material layer 52 of PMOS work function layer, causing the amount of aluminum ions in the second work function material layer 52 unstable. The difficulty for the total threshold voltage of the subsequently formed semiconductor structure to be stabilized at the target total threshold voltage value is further increased.

The aluminum ions in the second aluminum gate layer 19b of the NMOS region B can continuously diffuse into the second work function material layer 52 of the NMOS work function layer. Thus, the amount of aluminum ions in the second work function material layer 52 of the NMOS work function layer may continuously change. The original properties of the second work function material layer 52 may be changed and unstable. The NMOS threshold voltage of the subsequently formed N-type FinFET may be fluctuating, and it may be difficult for the NMOS threshold voltage to be stabilized at the target NMOS threshold voltage value, and for the total threshold voltage of the subsequently formed semiconductor structure to be stabilized at the target total threshold voltage value.

Thus, when the threshold voltage of the subsequently formed semiconductor structure is adjusted to the target threshold voltage value, the aluminum ions diffused into the PMOS work function layer can cause the PMOS threshold voltage value of the P-type FinFET in the semiconductor structure to fluctuate substantially, and the aluminum ions diffused into the second work function material layer 52 of the NMOS work function layer can cause the NMOS threshold voltage value of the N-type FinFET in the semiconductor structure to fluctuate substantially. Thus, the total threshold voltage of such semiconductor structure is difficult to be stabilized at the target total threshold voltage value. Certain improvements are further provided to decrease the difficulty to adjust the total threshold voltage of such semiconductor structure to the target total threshold voltage value.

Embodiment One

This embodiment provides a fabrication method for forming a semiconductor structure. The semiconductor structure is a semiconductor structure in an SRAM cell. The structure includes a P-type FinFET and an N-type FinFET with connected gates.

Figure 22:
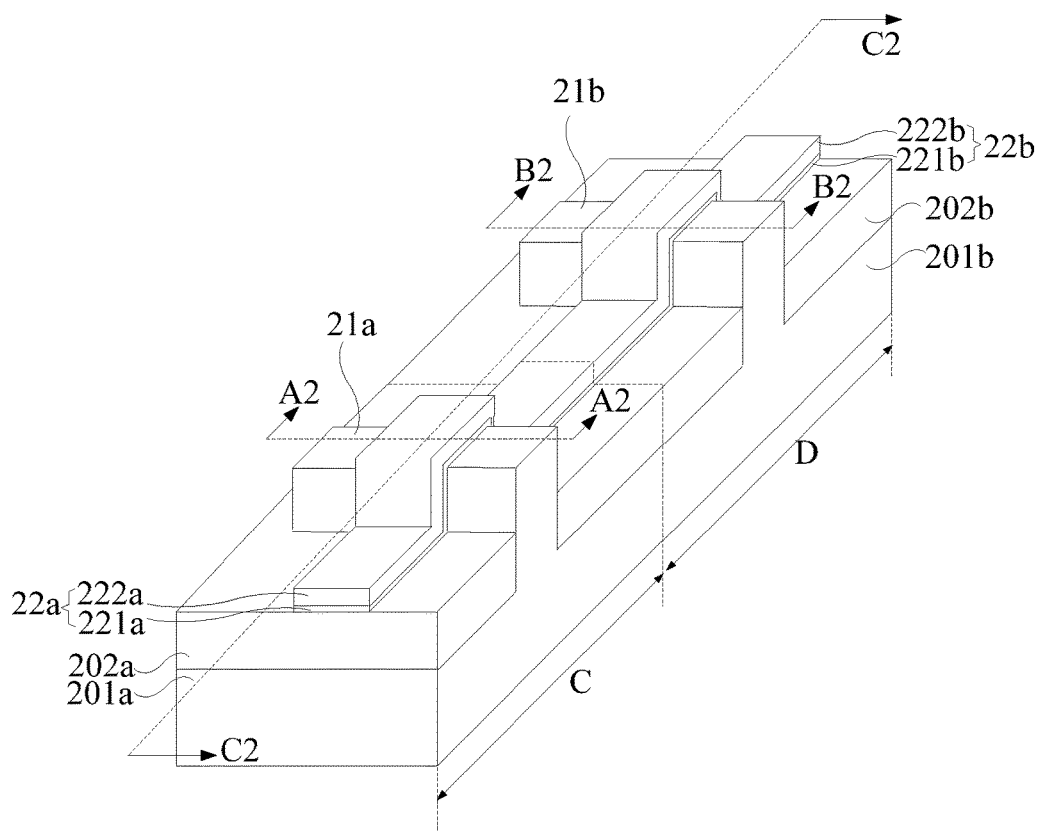
FIG. 22 is a 3D schematic view of a semiconductor substrate with a PMOS region and an NMOS region, and a first polysilicon gate structure and a second polysilicon gate structure.
Figure 23:
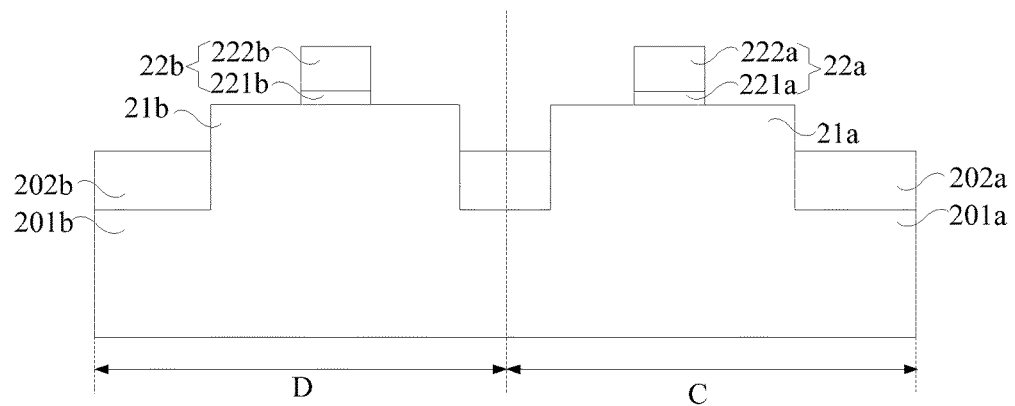
FIG. 23 is cross-sectional view along the direction of A2A2 and B2B2 in FIG. 22.
Figure 24:
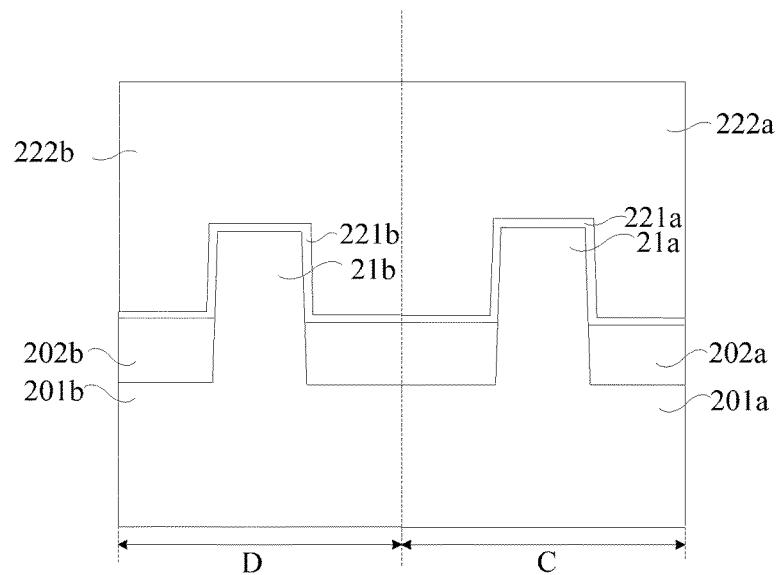
FIG. 24 is a cross-sectional view along the direction C2C2 in FIG. 22.

Referring to FIG. 22 to FIG. 24, a semiconductor substrate is provided. The substrate has a PMOS region C and an NMOS region D, and the PMOS region C and the NMOS region D are adjacent to each other. The PMOS region C has a first fin portion 21a, and the NMOS region D has a second fin portion 21b.

The semiconductor substrate in the PMOS region C has a silicon substrate 201a with at least two discrete protrusions and an insulating layer 202a between the protrusions. The insulating layer 202a is lower than the protrusions, and the part of the protrusion higher than the insulating layer 202a is the first fin portion 21a.

The semiconductor substrate in the NMOS region D has a silicon substrate 201b with at least two discrete protrusions and an insulating layer 202b between the protrusions. The insulating layer 202b is lower than the protrusions, and the part of the protrusion higher than the insulating layer 202b is the second fin portion 21b.

Further, referring to FIGS. 22-24, a first polysilicon gate structure 22a is formed across the first fin portion 21a, and a second polysilicon gate structure 22b is formed across the second fin portion 21b. The first polysilicon gate structure 22a includes a first gate oxide layer 221a and a polysilicon gate layer 222a located on the first gate oxide layer 221a. The second polysilicon gate structure 22b includes a second gate oxide layer 221b and a polysilicon gate layer 222b located on the second gate oxide layer 221b. The first gate oxide layer 221a and the second gate oxide layer 221a may both be made of silicon oxide.

Figure 25:
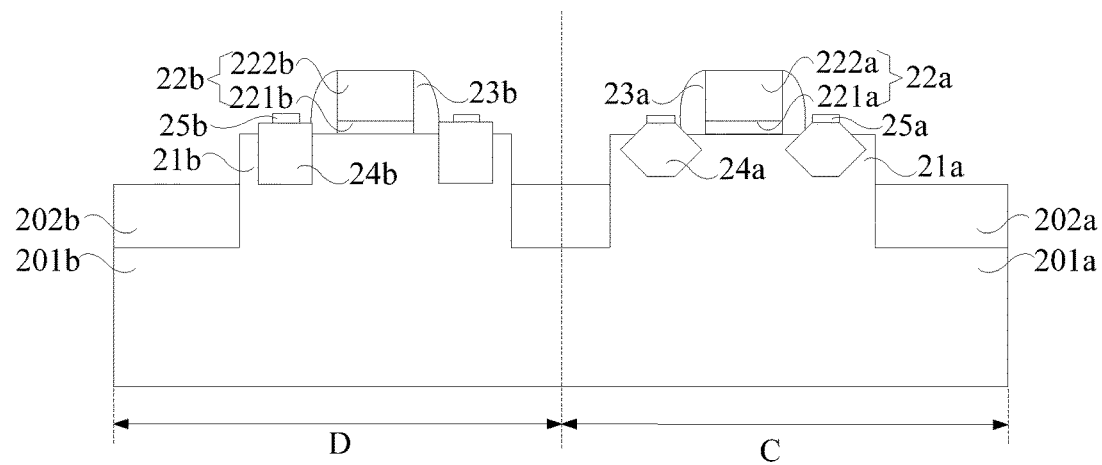
FIG. 25, FIG. 27, FIG. 29, FIG. 31, FIG. 33, FIG. 35, FIG. 37, FIG. 39, FIG. 41, FIG. 43 and FIG. 45 are cross-sectional views along A2A2 direction and B2B2 direction of semiconductor structures corresponding to certain stages of a fabrication process following FIG. 23.
Figure 26:
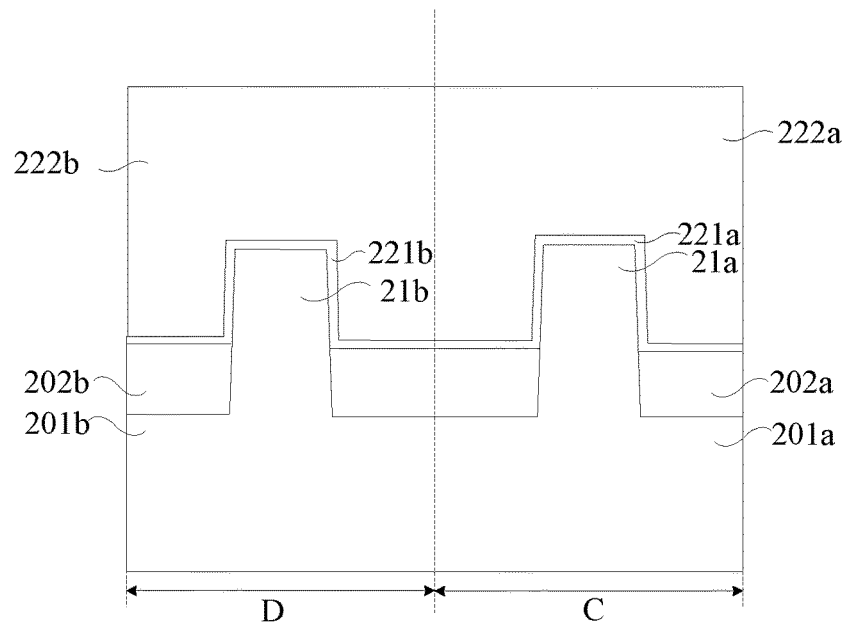
FIG. 26, FIG. 28, FIG. 30, FIG. 32, FIG. 34, FIG. 36, FIG. 38, FIG. 40, FIG. 42, FIG. 44 and FIG. 46 are cross-sectional views along C2C2 direction of semiconductor structures corresponding to certain stages of a fabrication process following FIG. 24, corresponding to FIG. 25, FIG. 27, FIG. 29, FIG. 31, FIG. 33, FIG. 35, FIG. 37, FIG. 39, FIG. 41, FIG. 43 and FIG. 45.

Referring to FIG. 25 and FIG. 26, a first sidewall spacer 23a is formed around the first polysilicon gate structure 22a in the PMOS region C, and a second sidewall spacer 23b is formed around the second polysilicon gate structure 22b in the NMOS region D. Each of the first sidewall spacer 23a and the second sidewall spacer 23b may include a silicon oxide layer on the bottom and a silicon nitride layer on the silicon oxide layer.

Further, referring to FIG. 25 and FIG. 26, a first source and first drain 24a is formed within the first fin portion 21a on both sides of the first sidewall spacer 23a. More specifically, using the first sidewall spacer 23a as a mask, a part of the height of the first fin portion 21a on two sides of the first sidewall spacer 23a is removed from top to bottom. Further, a first stress layer is formed by in-situ doping and growth on the remaining portion of the first fin 21a. The first stress layer may be made of silicon-germanium, the doping ions in the first stress layer are the first source-drain ions, such as the boron ions. Thus, the first source and first drain 24a is formed.

After forming the first stress layer, a first covering layer 25a may be formed by in-situ doping and growth on the first stress layer. The first covering layer 25a may be used to subsequently form a first metal silicide layer, so as to reduce the contact resistance between subsequently-formed first source contact plug, first drain contact plug, and corresponding first source and first drain.

The first covering layer 25a may be made of silicon, and the doping ions in the first covering layer 25a may be a first Schottky barrier lowering ions and/or boron ions. The first Schottky barrier lowering ions may include one or more of aluminum ions, gallium ions, germanium ions, and indium ions.

After forming the first covering layer 25a, a first metal layer (not shown) may be formed on the first covering layer 25a. Thereafter, a first rapid thermal annealing process may be performed on the first covering layer 25a to melt the first metal layer into the first covering layer 25a to form a first metal silicide layer. The thickness of the first metal silicide layer is less than the thickness of the first covering layer 25a.

The reason to dope the first Schottky barrier lowering ions in the first covering layer 25a includes the followings. In the subsequent process after doping, during the annealing process to form the first metal silicide layer 25a, the first Schottky barrier lowering ions doped in the first cover layer 25a may have a smaller solid solubility value in the first metal silicide layer, but a larger solid solubility value in the first covering layer 25a. Thus, when forming the first metal silicide layer, a large number of the first Schottky barrier lowering ions may be precipitated from the bottom boundary of the first metal silicide layer.

That is, these ions can be precipitated on the interface between the first metal silicide layer and the first covering layer, and form an electric dipole (dipole) layer between the first metal silicide layer and the first covering layer. The electrical dipole layer can produce an electric field in the same direction as the electron motion, reducing the width and height of the potential barrier for the carriers in the first covering layer 25a to leap to the metal, such that the carriers can leap directly to the metal. That is, the Schottky barrier width and Schottky barrier height, $\varphi Bn$, are reduced, the parasitic resistance of the first source and first drain of the subsequently formed P-type FinFET is also reduced, and the performance of the subsequently formed P-type FinFET is improved.

The reason to dope the boron ions in the first covering layer 25a includes the followings. The doped boron ions may be in non-substitution positions in the crystal lattice of the first covering layer 25a. During the annealing process to form the first metal silicide layer, the boron ions are activated to occupy the crystal lattice of the first covering layer 25a. Because the contact resistance of the first covering layer 25a is inversely proportional to the concentration of the doping boron ions (ND, n-type doping concentration), doping boron ions in the first covering layer 25a and increasing the doping concentration of the boron ions can reduce the contact resistance of the first covering layer 25a.

In certain embodiments, the doping ions in the first covering layer 25a may only include the first Schottky barrier lowering ions without the boron ions. In another embodiment, the doping ions in the first covering layer 25a may only include the boron ions without the first Schottky barrier lowering ions. Further, the first stress layer can also be formed by: using the first sidewall spacer as the mask to etch the first fin portion on two sides of the first sidewall spacer; forming a first groove in the first fin portion on two sides of the first sidewall spacer; forming the first stress layer by in-situ doing and growth in the first groove.

Further, a second source and second drain 24b is formed within the second fin portion 21b on both sides of the second sidewall spacer 23b. More specifically, using the second sidewall spacer 23b as a mask, a part of the height of the second fin portion 21b on two sides of the second sidewall spacer 23b is removed from top to bottom. Further, a second stress layer is formed by in-situ doping and growth on the remaining portion of the second fin portion 21b. The second stress layer may be made of silicon carbide, the doping ions in the second stress layer are second source-drain ions, such as phosphate ions. Thus, the second source and second drain 24b is formed.

After forming the second stress layer, a second covering layer 25b may be formed by in-situ doping and growth on the second stress layer. The second covering layer 25b may be used to subsequently form a second metal silicide layer, so as to reduce the contact resistance between subsequently-formed second source contact plug, second drain contact plug, and corresponding second source and second drain.

The second covering layer 25b may be made of silicon, and the doping ions in the second covering layer 25b may be a second Schottky barrier lowering ions and/or phosphorus ions. The second Schottky barrier lowering ions may include one or more of sulfur ions, selenium ions, arsenic ions, antimony ions, and germanium ions.

After forming the second covering layer 25b, a second metal layer (not shown) may be formed on the second covering layer 25b. Thereafter, a second rapid thermal annealing process may be performed on the second covering layer 25b to melt the second metal layer into the second covering layer 25b to form a second metal silicide layer. The thickness of the second metal silicide layer is less than the thickness of the second covering layer 25b.

The reason to dope the second Schottky barrier lowering ions in the second covering layer 25b includes the followings. In the subsequent process after doping, during the annealing process to form the second metal silicide layer 25b, the second Schottky barrier lowering ions doped in the second covering layer 25b may have a smaller solid solubility value in the second metal silicide layer, but a larger solid solubility value in the second covering layer 25b. Thus, when forming the second metal silicide layer, a large number of the second Schottky barrier lowering ions may be precipitated from the bottom boundary of the second metal silicide layer.

That is, these ions can be precipitated on the interface between the second metal silicide layer and the second covering layer, and form an electric dipole (dipole) layer between the second metal silicide layer and the second covering layer. The electrical dipole layer can produce an electric field in the same direction as the electron motion, reducing the width and height of the potential barrier for the carriers in the second covering layer 25b to leap to the metal, such that the carriers can leap directly to the metal. That is, the Schottky barrier width and Schottky barrier height, $\varphi Bn$, are reduced, the parasitic resistance of the first source and first drain of the subsequently formed N-type FinFET is also reduced, and the performance of the subsequently formed N-type FinFET is improved.

The reason to dope the phosphorus ions in the second covering layer 25b includes the followings. The doped phosphorus ions may be in non-substitution positions in the crystal lattice of the second covering layer 25b. During the annealing process to form the second metal silicide layer, the phosphorus ions are activated to occupy the crystal lattice of the second covering layer 25b. Because the contact resistance of the second covering layer 25b is inversely proportional to the concentration of the doping phosphorus ions (ND, n-type doping concentration), doping phosphorus ions in the second covering layer 25b and increasing the doping concentration of the phosphorus ions can reduce the contact resistance of the second covering layer 25b.

In certain embodiments, the doping ions in the second covering layer 25b may only include the second Schottky barrier lowering ions without the phosphorus ions. In another embodiment, the doping ions in the second covering layer 25b may only include the phosphorus ions without the second Schottky barrier lowering ions. Further, the second stress layer can also be formed by: using the second sidewall spacer as the mask to etch the second fin portion on two sides of the second sidewall spacer; forming a second groove in the second fin portion on two sides of the second sidewall spacer; forming the second stress layer by in-situ doing and growth in the second groove.

Figure 27:
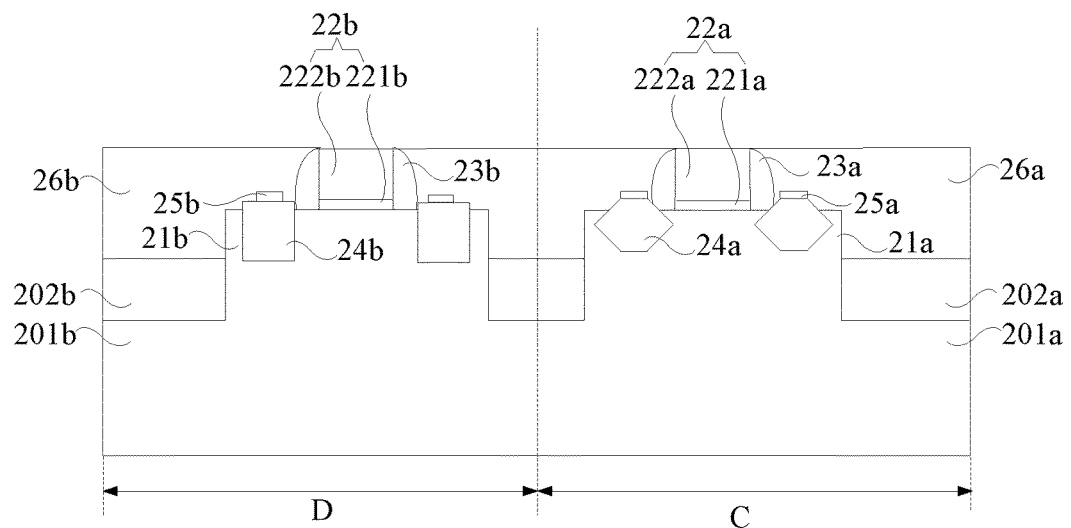
Figure 28:
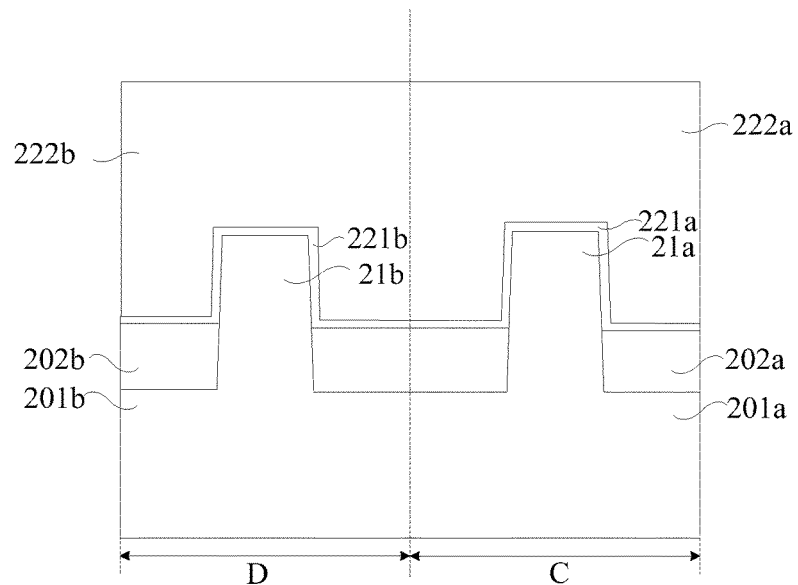

Further, referring to FIG. 27 and FIG. 28, a first dielectric layer 26a is formed on the semiconductor substrate in the PMOS region C, the first metal silicide 25a, the first polysilicon gate structure 22a, and the first sidewall spacer 23a. The first dielectric layer 26a is flush with the first polysilicon gate structure 22a. The first dielectric layer 26a may be made of silicon oxide, a low-k dielectric material, or an ultra low-k dielectric material. The dielectric constant of the low-k dielectric material may be less than or equal to approximately 3, the dielectric constant of the ultra-low-k dielectric material may be less than or equal to approximately 2.7.

Further, a second dielectric layer 26b is formed on the semiconductor substrate in the NMOS region D, the second metal silicide layer 25b, the second polysilicon gate structure 22b, and the second sidewall spacer 23b. The second dielectric layer 26b is flush with the second polysilicon gate structure 22b. The second dielectric layer 26b may be made of silicon oxide, a low-k dielectric material, or an ultra low-k dielectric material. The dielectric constant of the low-k dielectric material may be less than or equal to approximately 3, the dielectric constant of the ultra-low-k dielectric material may be less than or equal to approximately 2.7.

The first dielectric layer 26a and the second dielectric layer 26b may be made of the same material, and/or formed in a same process. In other embodiments, the first dielectric layer 26a and the second dielectric layer 26b may be formed in different processes.

Figure 29:
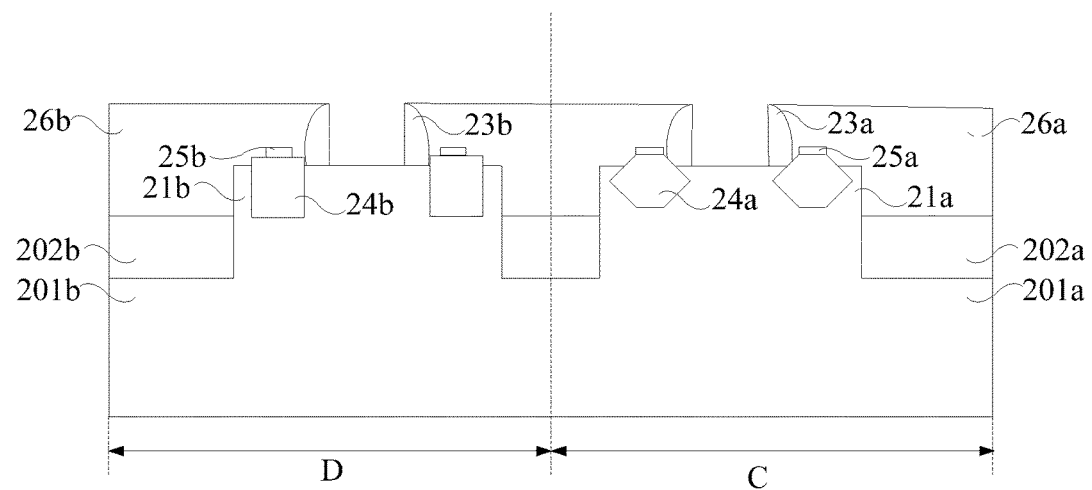
Figure 30:
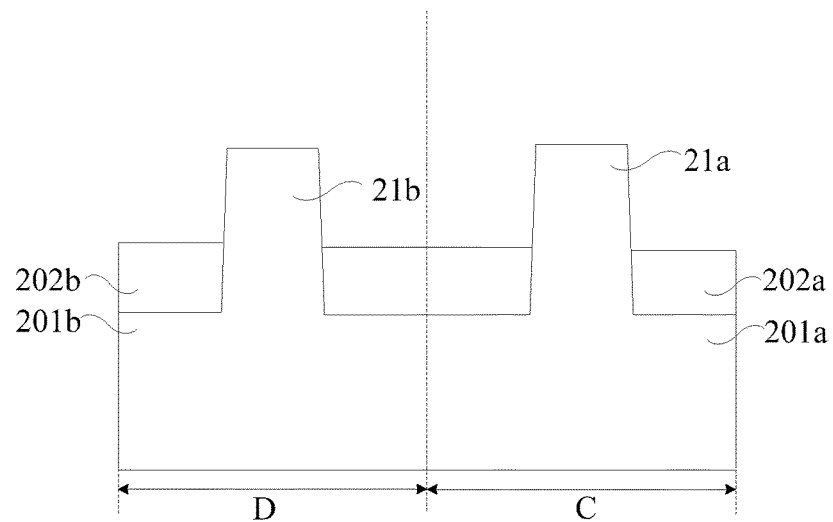

Further, referring to FIG. 29 and FIG. 30, the first polysilicon gate structure 22a is removed, and a first gate structure recess is formed in the first dielectric layer 26a. The first fin portion 21a is exposed at the bottom of the first gate structure recess. The second polysilicon gate structure 22b is removed, and a second gate structure recess is formed in the second dielectric layer 26b. The second fin portion 21b is exposed at the bottom of the second gate structure recess.

Figure 31:
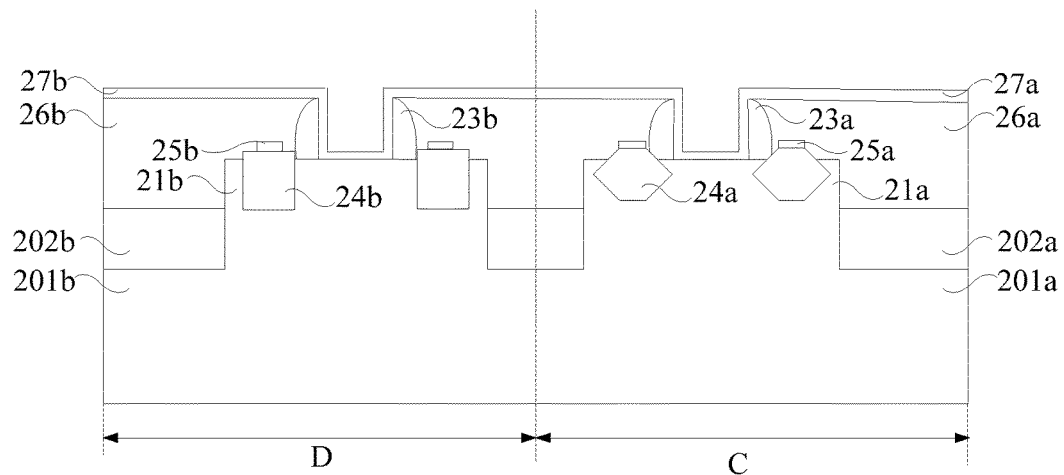
Figure 32:
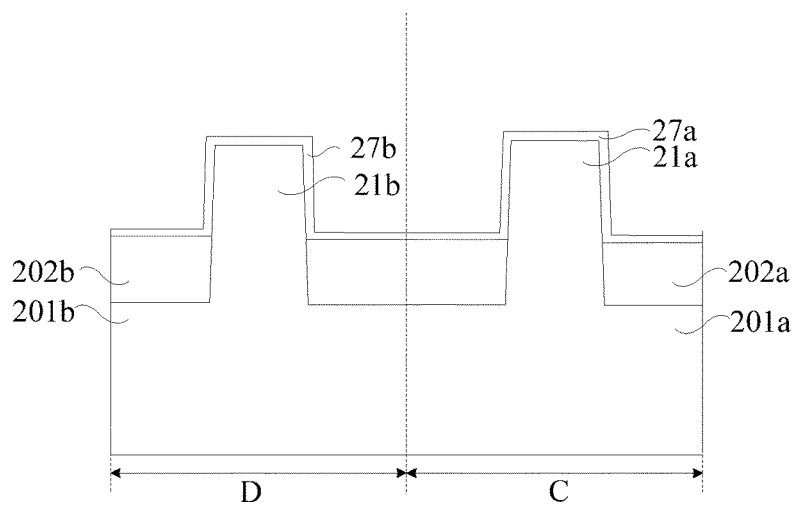

Referring to FIG. 31 and FIG. 32, a first stack structure 27a is formed by the first dielectric layer 26a, and the bottom and sidewalls of the first gate structure recess. The first stack structure 27a includes a first interface layer (not shown), a first high-k gate dielectric layer (not shown) on the first interface layer, and a first protective layer (not shown) on the first high-k gate dielectric layer. The first interface layer is used to increase the binding force between the first fin portion 21a and the first high-k gate dielectric layer.

The first interface layer may be made of silicon oxide. The first high-k gate dielectric layer may be made of HfO2, Al2O3, ZrO2, HfSiO, HfSiON, HfTaO, and/or HfZrO. The first protective layer is used to prevent oxygen in the reaction chamber from diffusing into the first high-k gate dielectric layer and to affect the first high-k gate dielectric layer, and to prevent the phono scattering effect from impacting the performance of the first high-k gate dielectric layer. The first protective layer may be made of titanium nitride.

A second stack structure 27b is formed by the second dielectric layer 26b, and the bottom and sidewalls of the second gate structure recess. The second stack structure 27b includes a second interface layer (not shown), a second high-k gate dielectric layer (not shown) on the second interface layer, a second protective layer (not shown) on the second high-k gate dielectric layer, and a second etch stop layer (not shown) on the second protective layer. The second etch stop layer is used as the stop layer for subsequently removing a first work function material layer in the NMOS region D. That is, when removing the first work function material layer in the NMOS region D, the second etch stop layer can be used to protect the second protective layer and other lower layers from being damaged. The second etch stop layer may be made of tantalum nitride.

The second interface layer is used to increase the binding force between the second fin portion 21b and the second high-k gate dielectric layer. The second interface layer may be made of silicon oxide. The second high-k gate dielectric layer may be made of HfO2, Al2O3, ZrO2, HfSiO, HfSiON, HfTaO, and/or HfZrO. The second protective layer is used to prevent oxygen in the reaction chamber from diffusing into the second high-k gate dielectric layer and to affect the second high-k gate dielectric layer, and to prevent the phono scattering effect from impacting the performance of the second high-k gate dielectric layer. The second protective layer may be made of titanium nitride.

Figure 33:
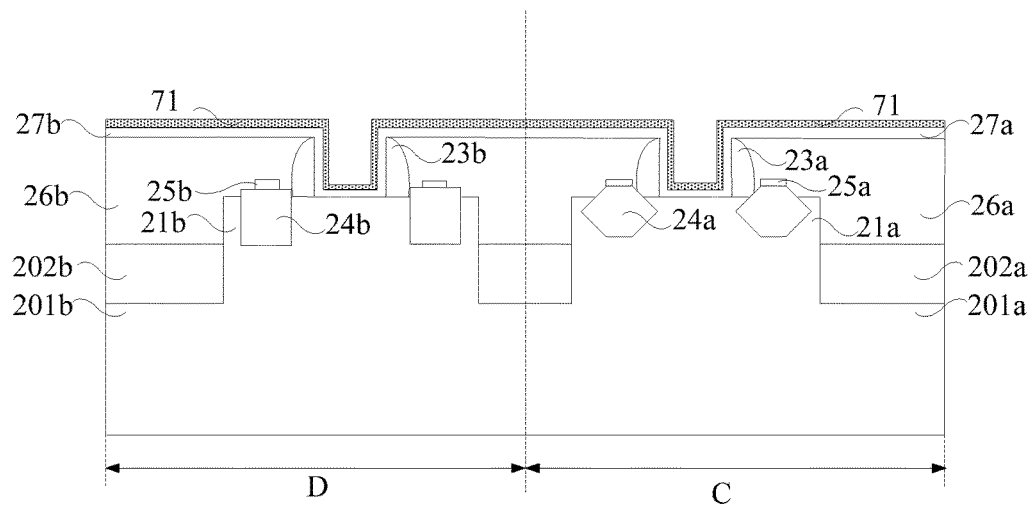
Figure 34:
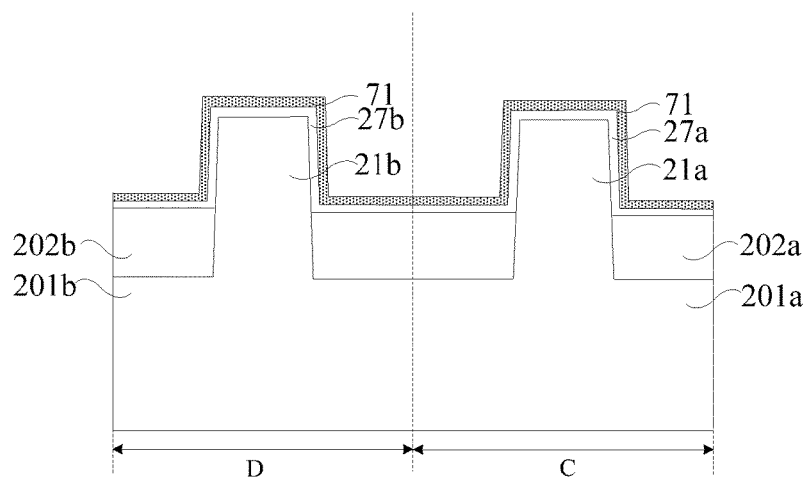

Further, referring to FIG. 33 and FIG. 34, a first work function material layer 71 is formed on the first stack structure 27a and the second stack structure 27b. The first work function material layer 71 may be made of TiN or TiSiN. Other materials may also be used. The first work function material layer 71 may be formed by using a physical vapor deposition (PVD) process or a chemical vapor deposition (CVD) process. When using the chemical vapor deposition process, an atomic layer deposition (ALD) can be used to obtain a more uniform first work function material layer 71.

Figure 35:
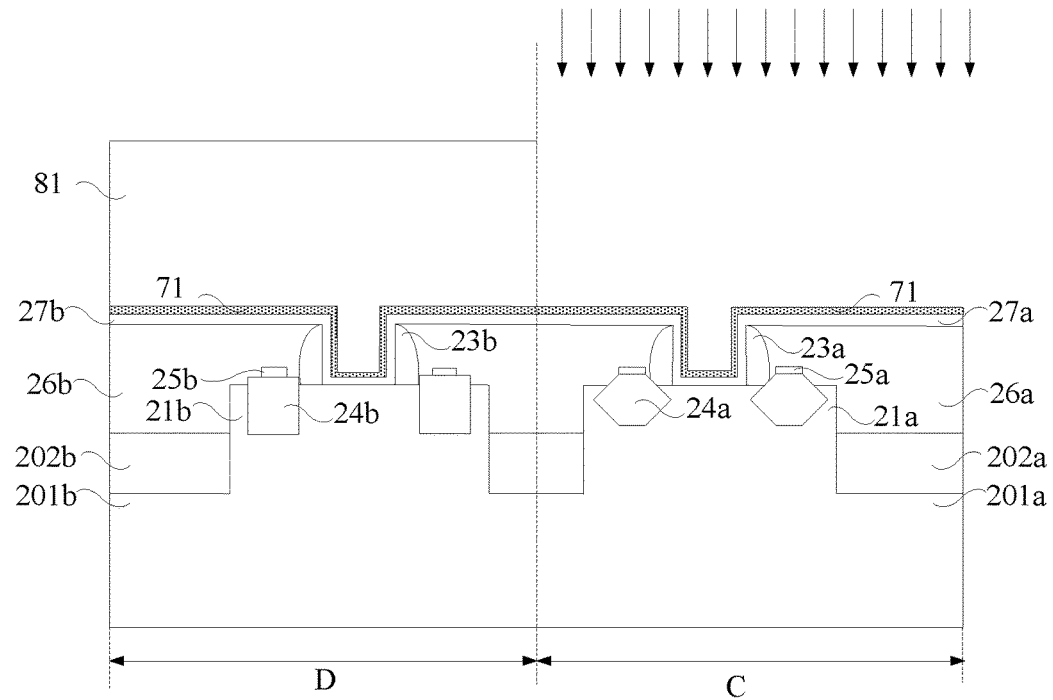
Figure 36:
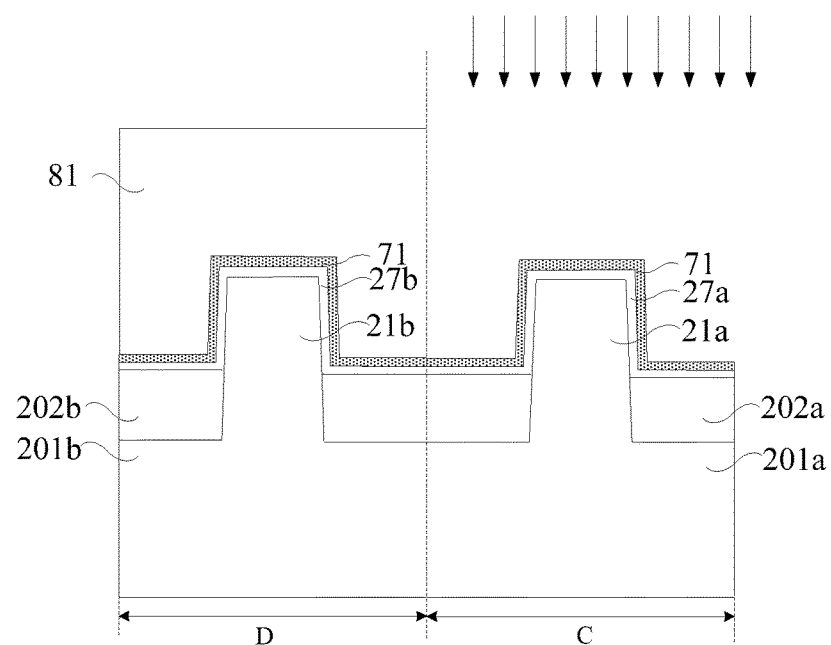

Referring to FIG. 35 and FIG. 36, a patterned first mask layer 81 may be formed on the first work function material layer 71 in the NMOS region D, and the patterned first mask layer 81 may expose the first work function material layer 71 in the PMOS region C.

Further, using the patterned first mask layer 81 as a mask, a first ion implantation process may be performed on the first work function material layer 71 in the PMOS region C. Because, in subsequent processes, aluminum ions in the NMOS work function layer, a second work function material layer of the PMOS work function layer, and the first aluminum gate layer can continuously diffuse into the first work function material layer 71. Thus, the concentration of the aluminum ions in the first work function material layer 71 is constantly changing.

By performing the first ion implantation on the first work function material layer 71 in the PMOS region C, the work function value of the first work function material layer can be kept in a saturated zone by the implanted ions from the first ion implantation, and does not fluctuate with the aluminum ion concentration in the first work function material layer. Thus, the PMOS threshold voltage value of the subsequently formed P-type FinFET, after being adjusted to the target PMOS threshold voltage value, does not fluctuate, reducing the difficulty to maintain the total threshold voltage value of the semiconductor structure at the target total threshold voltage value, and improving the performance of the subsequently formed semiconductor structure.

In one embodiment, the first ions in the first ion implantation may include at least one of fluoride ions and aluminum ions.

In certain embodiments, the first implantation dose of the first ion implantation is greater than or equal to 1E16 atom/cm$^3$ and not more than 4E16 atom/cm$^3$; and a first implantation energy is greater than or equal to 0.5 KeV and less than or equal to 2 KeV. If the first implantation dose of the first ion implantation is too large, and/or the first implantation energy is too large, too many defects may be introduced, affecting the performance of the first work function material layer.

If the first implantation dose of the first ion implantation is too small, and/or the first implantation energy is too small, after the PMOS threshold voltage value of the subsequently formed P-type FinFET is adjusted to the target PMOS threshold voltage value, the PMOS threshold voltage value may still fluctuate. The difficulty to maintain the total threshold voltage value of the semiconductor structure at the target total threshold voltage value is not substantially reduced.

For example, when the first implantation dose of the first ion implantation is greater than or equal to $1E16$ atom/cm$^3$ but less than or equal to $2E16$ atom/cm$^3$, the first implantation energy is greater than or equal to 0.5 KeV but less than or equal to 1 KeV, the PMOS threshold voltage value of the subsequently formed P-type FinFET can be adjusted to the appropriate target PMOS threshold voltage value within a range of greater than or equal to 0V but less than or equal to 0.05V. That is, the PMOS threshold voltage value can be stabilized at the respective target PMOS threshold voltage value.

When the first implantation dose of the first ion implantation is greater than or equal to $2E16$ atom/cm$^3$ but less than or equal to $4E16$ atom/cm$^3$, the first implantation energy is greater than or equal to 1 KeV but less than or equal to 2 KeV, the PMOS threshold voltage value of the subsequently formed P-type FinFET can be adjusted to the appropriate target PMOS threshold voltage value within a range of greater than or equal to 0.05V but less than or equal to 0.1V. That is, the PMOS threshold voltage value can be stabilized at the respective target PMOS threshold voltage value.

Thus, the first ion implantation process may be configured or optimized to reduce the cost of the first ion implantation, and to reduce damage to the subsequently formed semiconductor structure by the first ion implantation process.

Figure 37:
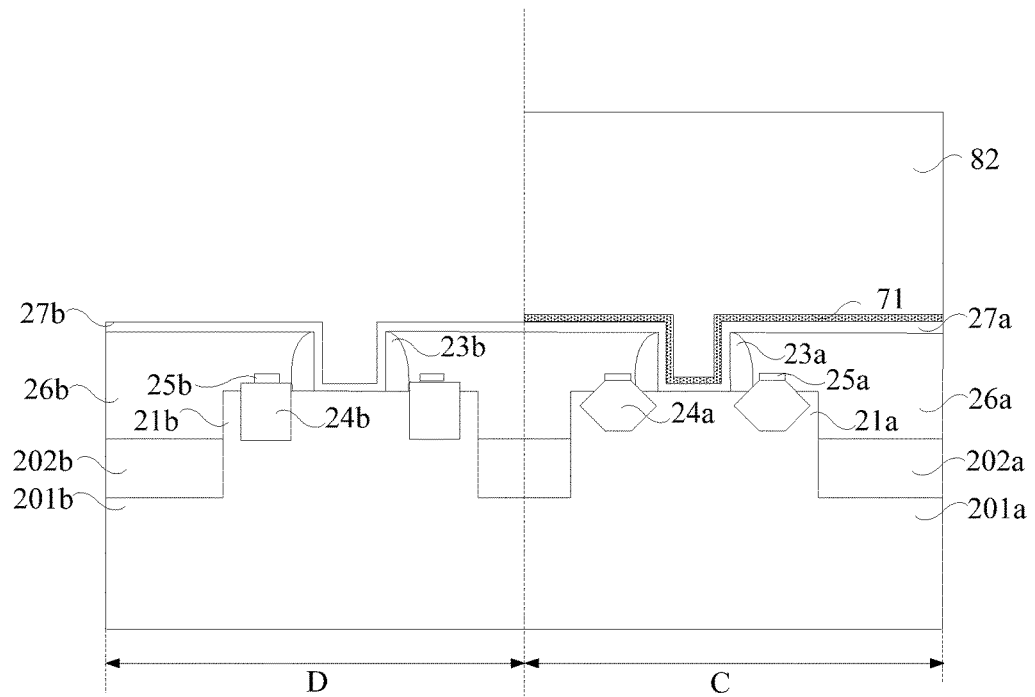
Figure 38:
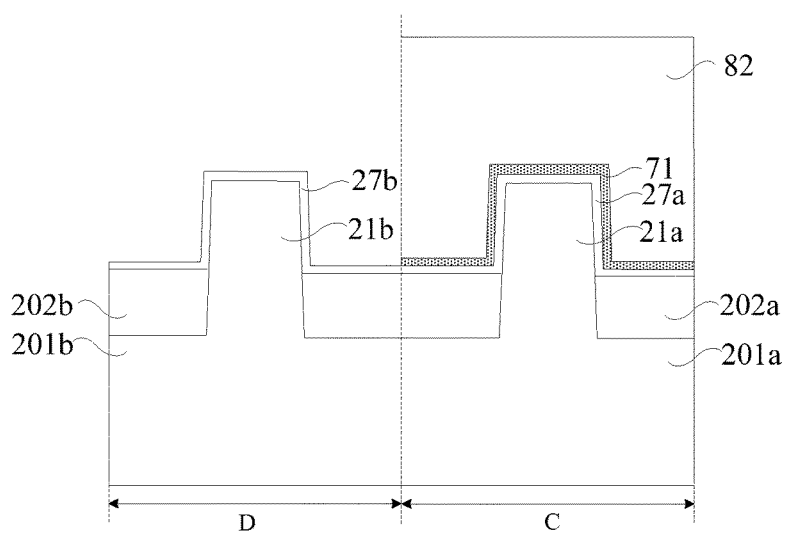

After the first ion implantation, the first patterned mask layer 81 may be removed by an ashing process. Further, referring to FIG. 37 and FIG. 38, the first work function material layer 71 in the NMOS region D is removed. More specifically, a patterned second mask layer 82 is formed in the PMOS region C, the patterned second mask layer 82 exposes the NMOS region D. Thereafter, using the patterned second mask layer 82 as a mask, the first work function material layer 71 in the NMOS region D is removed, until reaching the second etch stop layer (the uppermost layer of the second stack structure 27b).

Figure 39:
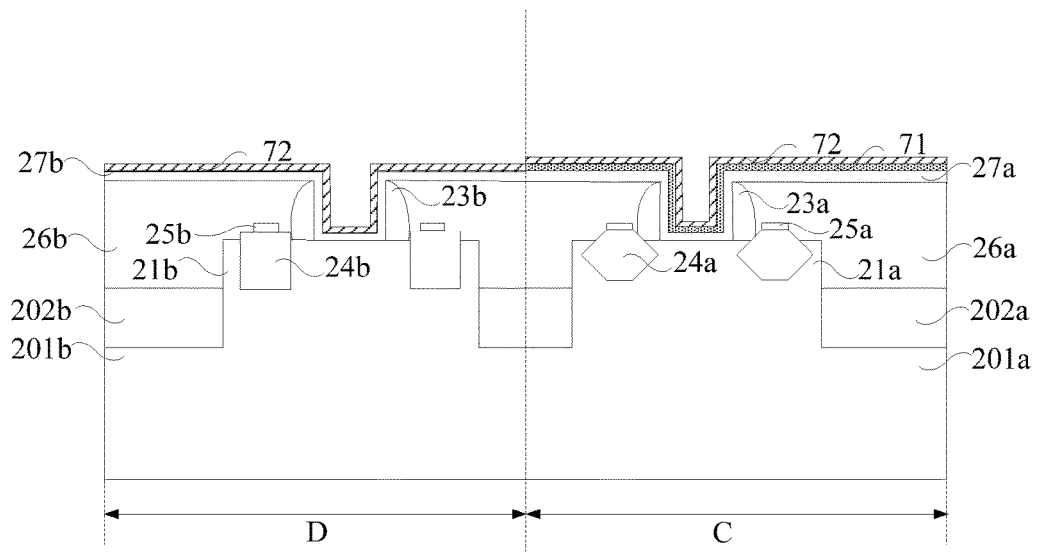
Figure 40:
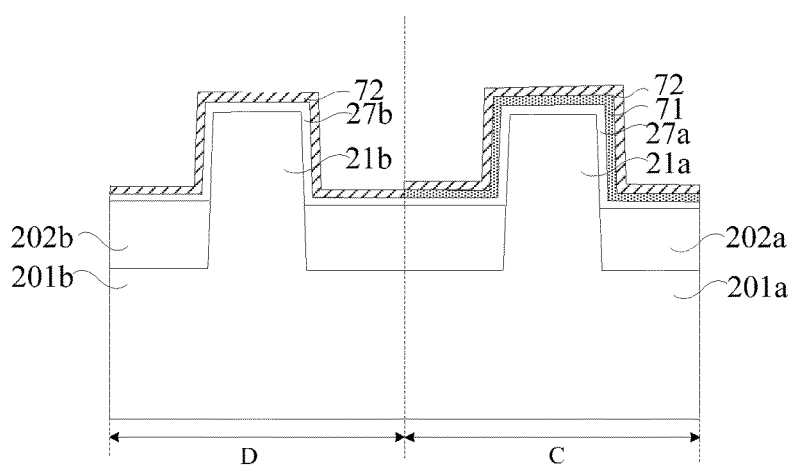

After removing the first work function material layer 71 in the NMOS region D, the patterned second mask layer 82 is removed by an ashing process. Further, referring to FIG. 39 and FIG. 40, a second work function material layer 72 is formed on the second stack structure 27b in the NMOS region D, and the first work function material layer 71 in the PMOS region C.

The second work function material layer 72 may be made of TiAl or TiCAl. Other materials may also be used. The second work function material layer 72 may be formed by using a physical vapor deposition (PVD) process or a chemical vapor deposition (CVD) process. When using the chemical vapor deposition process, an atomic layer deposition (ALD) can be used to obtain a more uniform second work function material layer 72.

Figure 41:
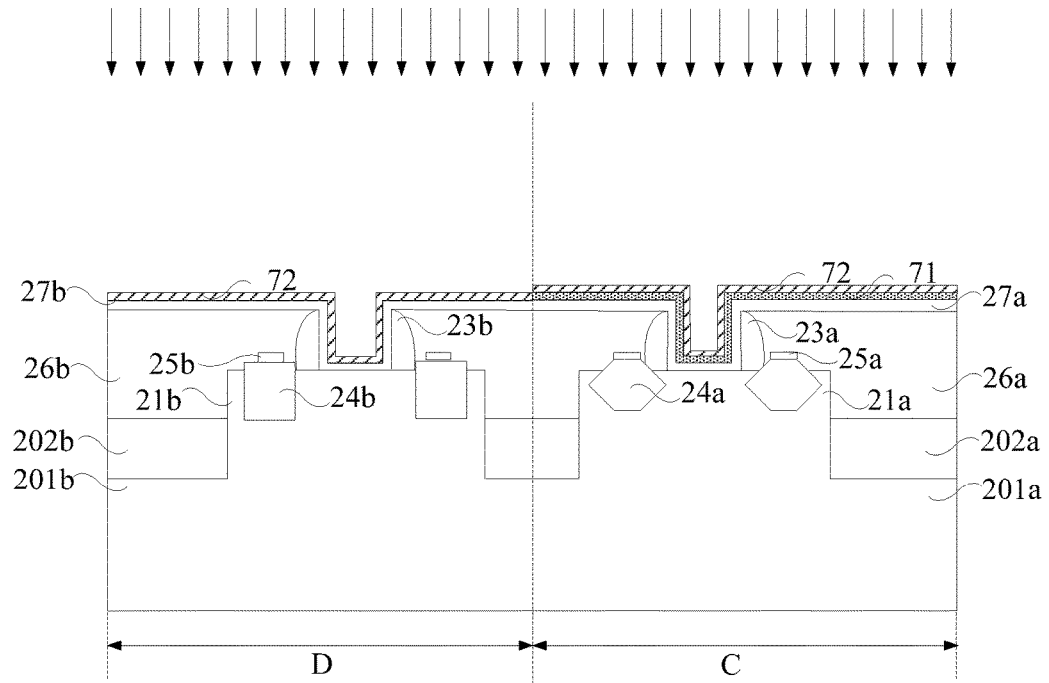
Figure 42:
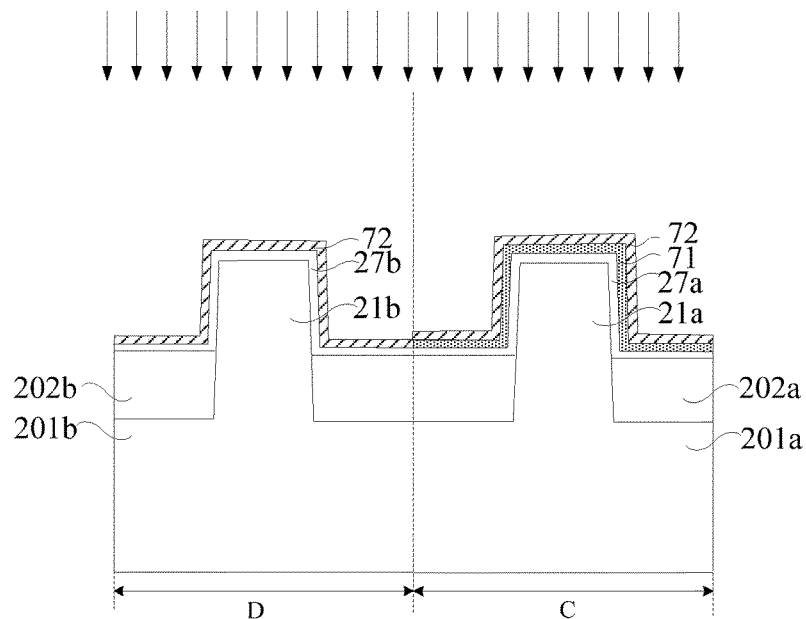

Further, referring to FIG. 41 and FIG. 42, a second ion implantation process may be performed on the second work function material layer 72 in the PMOS region C and the NMOS region D. Because, in subsequent processes, a first metal gate layer and a second metal gate layer are formed above the second work function material layer 72. The first metal gate layer and the second metal gate layer may be made of aluminum. The aluminum ions in the first metal gate layer and the second metal gate layer can continuously diffuse into the second work function material layer 72. Thus, the concentration of the aluminum ions in the second work function material layer 72 is constantly changing.

By performing the second ion implantation on the second work function material layer 72 in the PMOS region C and the NMOS region D, the work function value of the second work function material layer can be kept in a saturated zone by the implanted ions from the second ion implantation, and does not fluctuate with the aluminum ion concentration in the second work function material layer in the PMOS region C and the NMOS region D. Thus, fluctuation of the PMOS threshold voltage value of the subsequently formed P-type FinFET can be reduced. At the same time, the NMOS threshold voltage value of the subsequently formed N-type FinFET, after being adjusted to the target NMOS threshold voltage value, does not fluctuate.

Further, because the first ion implantation is performed on the first work function material layer in the PMOS region C, and the second ion implantation is again performed on the second work function material layer in the PMOS region C, the subsequently formed PMOS work function layer do not change with respect to changes of aluminum concentration in the PMOS work function layer. The PMOS threshold voltage value of the subsequently formed P-type FinFET, after being adjusted to the target PMOS threshold voltage value, does not fluctuate.

Thus, the NMOS threshold voltage value of the subsequently formed N-type FinFET, after being adjusted to the target NMOS threshold voltage value, does not fluctuate; and the PMOS threshold voltage value of the subsequently formed P-type FinFET, after being adjusted to the target PMOS threshold voltage value, also does not fluctuate. The NMOS threshold voltage value of the subsequently formed N-type FinFET and PMOS threshold voltage value of the subsequently formed P-type FinFET are stable. Thus, it may be easy to adjust the total threshold voltage value of the subsequently formed semiconductor structure to the target total threshold voltage value, and the subsequent total threshold voltage value is stable.

In certain embodiments, the second ion implantation process for the second work function material layer 72 in the PMOS region C and the NMOS region D may be performed as follows.

The second ions in the second ion implantation may include at least one of nitrogen ions and aluminum ions. In certain embodiments, the second implantation dose of second ion implantation is greater than or equal to $1E16$ atom/cm$^3$ and not more than $4E16$ atom/cm$^3$; and a second implantation energy is greater than or equal to 0.4K and less than or equal to 2.5K. If the second implantation dose of the second ion implantation is too large, and/or the second implantation energy is too large, too many defects may be introduced, affecting the performance of the second work function material layer.

If the second implantation dose of the second ion implantation is too small, and/or the second implantation energy is too small, after the NMOS threshold voltage value of the subsequently formed N-type FinFET is adjusted to the target NMOS threshold voltage value, the NMOS threshold voltage value may still fluctuate. The difficulty to maintain the total threshold voltage value of the semiconductor structure at the target total threshold voltage value is not substantially reduced.

For example, when the second implantation dose of the second ion implantation is greater than or equal to 1E16 atom/cm$^3$ but less than or equal to 2E16 atom/cm$^3$, the second implantation energy is greater than or equal to 0.4 KeV but less than or equal to 1.5 KeV, the NMOS threshold voltage value of the subsequently formed N-type FinFET can be adjusted to the appropriate target NMOS threshold voltage value within a range of greater than or equal to 0V but less than or equal to 0.2V. That is, the NMOS threshold voltage value can be stabilized at the respective target NMOS threshold voltage value.

When the second implantation dose of the second ion implantation is greater than or equal to 2E16 atom/cm$^3$ but less than or equal to 4E16 atom/cm$^3$, the second implantation energy is greater than or equal to 1.5 KeV but less than or equal to 2.5 KeV, the NMOS threshold voltage value of the subsequently formed N-type FinFET can be adjusted to the appropriate target NMOS threshold voltage value within a range of greater than or equal to 0.2V but less than or equal to 0.35V. That is, the NMOS threshold voltage value can be stabilized at the respective target NMOS threshold voltage value.

In certain other embodiments, with respect to the second work function material layer in the PMOS region, the first work function material layer in the PMOS region is farther away from the channel. Thus, the second ion implantation might not be performed on the first work function material layer in the PMOS region, without significant effect on the PMOS threshold voltage value of the subsequently formed P-type FinFET. However, a step of forming a third patterned mask layer may be added.

More specifically, a third patterned mask layer may be formed on the first work function material layer in the PMOS region, and the third patterned mask layer exposes the second work function material layer in the NMOS region. Further, using the third patterned mask layer as a mask, the second ion implantation is performed only on the second work function material layer in the NMOS region.

Figure 43:
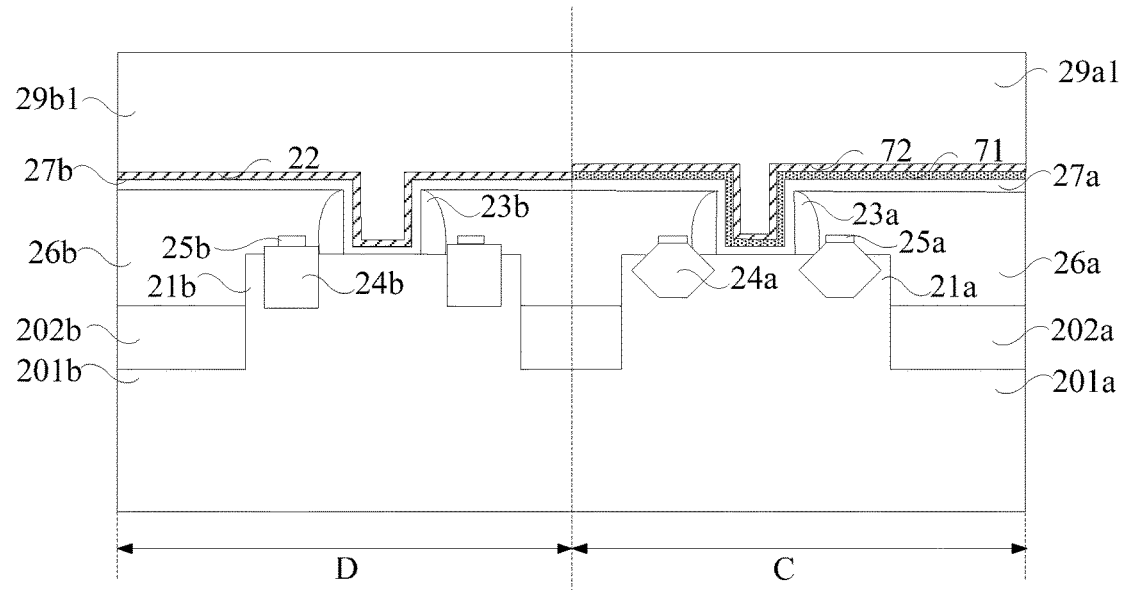
Figure 44:
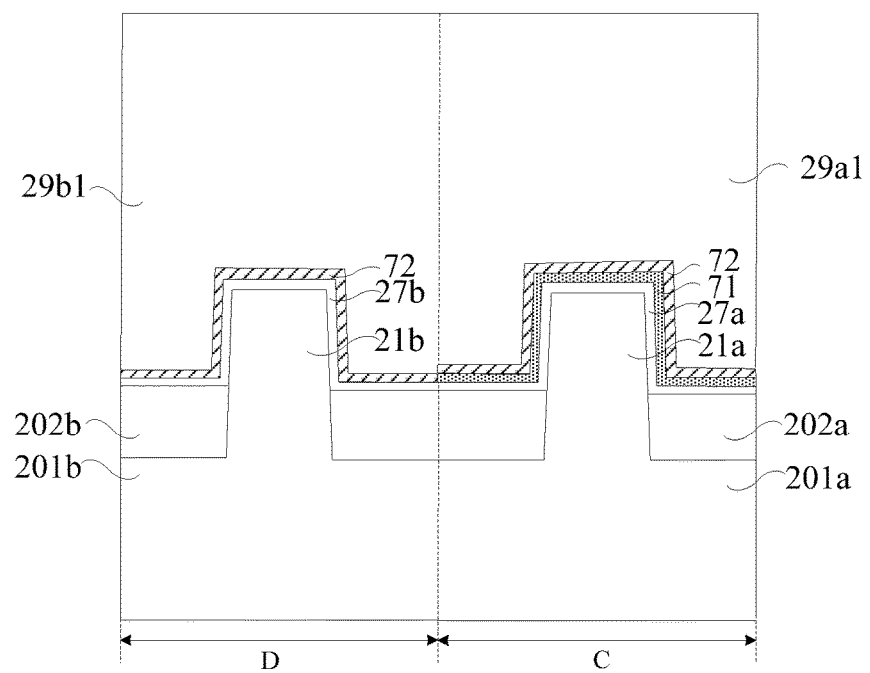

Further, referring to FIG. 43 and FIG. 44, a first gate material layer 29a1 may be formed on the second work function material layer 72 in the PMOS region C, and the first gate material layer 29a1 may be made of aluminum. Further, a second gate material layer 29b1 may be formed on the second work function material layer 72 in the NMOS region D, and the second gate material layer 29b1 may be made of aluminum.

Figure 45:
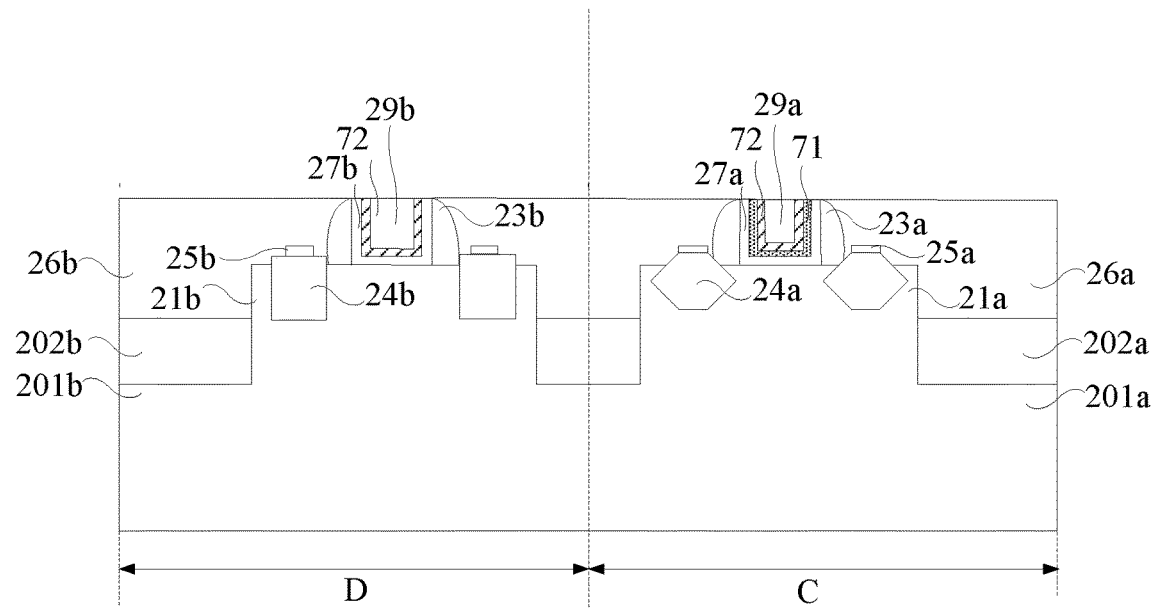
Figure 46:
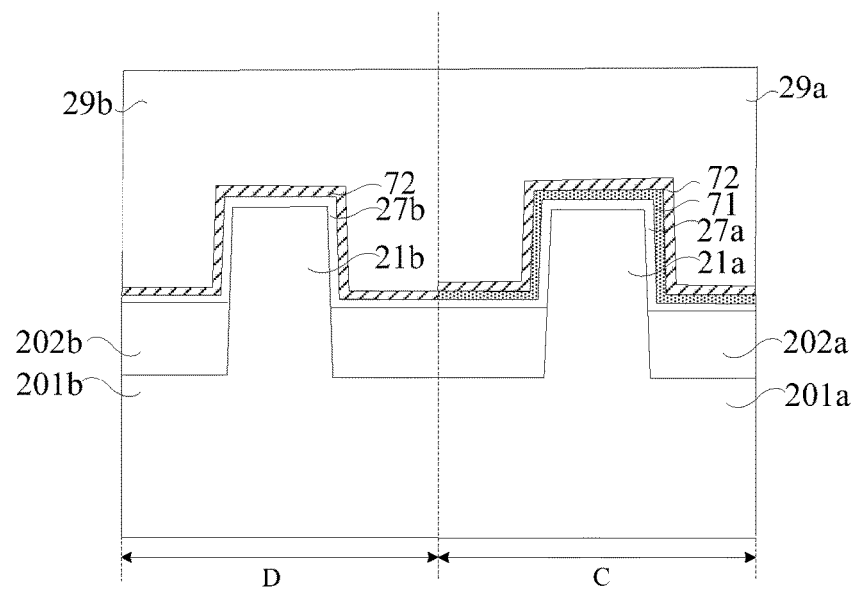

Referring to FIG. 45 and FIG. 46, the portion of the first stack structure 27a, first work function material layer 71, second work function material layer 72, and first gate material layer 29a1 that are higher than the first dielectric layer 26a is removed. The remaining first gate material layer 29a1 is the first gate layer 29a, forming the first gate structure together with the remaining first work function material layer 71, second work function material layer 72, and first stack structure 27a. The remaining first work function material layer 71 and the remaining second work function material layer 72 were stacked to form the PMOS work function layer.

Further, the portion of the second stack structure 27b, second work function material layer 72, and second gate material layer 29b1 that are higher than the second dielectric layer 26b is removed. The remaining second gate material layer 29b1 is the second gate layer 29b, forming the second gate structure together with the remaining second work function material layer 72, and second stack structure 27b. The remaining second work function material layer 72 forms the NMOS work function layer.

During the fabrication process, alternatively, the first ion implantation is performed on the first work function material layer in the PMOS region, and the second ion implantation is performed on the second work function material layer in the NMOS region, but not for the second work function material layer in the PMOS region. Alternatively, the second ion implantation is performed on the second work function material layer in the PMOS region, as well as the second work function material layer in the NMOS region. Alternatively, only the second ion implantation is performed on the second work function material layer in the NMOS region, without performing the first ion implantation on the first work function material layer in the PMOS region, or performing the second ion implantation on the second work function material layer in the PMOS region.

Embodiment Two

Based on Embodiment One, and referring to FIGS. 45 and 46, a semiconductor structure includes a semiconductor substrate. The substrate has a PMOS region C and an NMOS region D, and the PMOS region C is adjacent to the NMOS region D. The PMOS region C has a first fin portion, and the NMOS region D has a second fin portion.

A first dielectric layer 26a is formed on the semiconductor substrate in the PMOS region C, the first dielectric layer 26a contains a first gate structure recess, and the first gate structure recess exposes the first fin portion 21a at the bottom of the first gate structure recess. A second dielectric layer 26b is formed on the semiconductor substrate in the NMOS region D, the second dielectric layer 26b contains a second gate structure recess, and the second gate structure recess exposes the second fin portion 21b.

A PMOS work function layer is formed on the bottom and sidewalls of the first gate structure recess, across the first fin portion 21a and covering the top and sidewalls of the first fin portion 21a. An NMOS work function layer is formed on the bottom and sidewalls of the gate structure recess, across the second fin portion 21b and covering the top and sidewalls of the second fin portion 21b.

The PMOS work function layer is the stacked first work function material layer 71 and second work function material layer 72. The NMOS work function layer includes the second work function material layer 72. The first work function material layer 71 may be made of TiN or TiSiN, and the second work function material layer 72 may be made of TiAl or TiCAl.

The first work function material layer 71 of the PMOS work function layer is doped with first ions, and second work function material layer 72 of the PMOS work function layer and the second work function material layer 72 of the NMOS work function layer are doped with second ions.

The first ions of the first ion implantation includes at least one of fluorine ions and aluminum ions, and the second ions of the second ion implantation include at least one of nitrogen ions or aluminum ions.

The first implantation does of the first ion implantation is greater than or equal to 1E16 atom/cm$^3$ but less than or equal to 2E16 atom/cm$^3$, the first implantation energy is greater than or equal to 0.5 KeV but less than or equal to 1 KeV. Alternatively, the first implantation dose is greater than or equal to 2E16 atom/cm$^3$ but less than or equal to 4E16 atom/cm$^3$, and the first implantation energy is greater than or equal to 1 KeV but less than or equal to 2 KeV.

The second implantation dose of the second ion implantation is greater than or equal to 1E16 atom/cm$^3$ but less than or equal to 2E16 atom/cm$^3$, and the second implantation energy is greater than or equal to 0.4 KeV but less than or equal to 1.5 keV. Alternatively, the second implantation dose is greater than or equal to 2E16 atom/cm$^3$ but less than or equal to 4E16 atom/cm$^3$, and the second implantation energy is greater than or equal to 1.5 KeV but less than or equal to 2.5 KeV.

Further, when the first implantation dose of the first ion implantation is greater than or equal to 1E16 atom/cm$^3$ but less than or equal to 2E16 atom/cm$^3$, the first implantation energy is greater than or equal to 0.5 KeV but less than or equal to 1 KeV, the PMOS threshold voltage value of the subsequently formed P-type FinFET can be adjusted to the appropriate target PMOS threshold voltage value within a range of greater than or equal to 0V but less than or equal to 0.05V. That is, the PMOS threshold voltage value can be stabilized at the respective target PMOS threshold voltage value.

When the first implantation dose of the first ion implantation is greater than or equal to 2E16 atom/cm$^3$ but less than or equal to 4E16 atom/cm$^3$, the first implantation energy is greater than or equal to 1 KeV but less than or equal to 2 KeV, the PMOS threshold voltage value of the subsequently formed P-type FinFET can be adjusted to the appropriate target PMOS threshold voltage value within a range of greater than or equal to 0.05V but less than or equal to 0.1V. That is, the PMOS threshold voltage value can be stabilized at the respective target PMOS threshold voltage value.

When the second implantation dose of the second ion implantation is greater than or equal to 1E16 atom/cm$^3$ but less than or equal to 2E16 atom/cm$^3$, the second implantation energy is greater than or equal to 0.4 KeV but less than or equal to 1.5 KeV, the NMOS threshold voltage value of the subsequently formed N-type FinFET can be adjusted to the appropriate target NMOS threshold voltage value within a range of greater than or equal to 0V but less than or equal to 0.2V. That is, the NMOS threshold voltage value can be stabilized at the respective target NMOS threshold voltage value.

When the second implantation dose of the second ion implantation is greater than or equal to 2E16 atom/cm$^3$ but less than or equal to 4E16 atom/cm$^3$, the second implantation energy is greater than or equal to 1.5 KeV but less than or equal to 2.5 KeV, the NMOS threshold voltage value of the subsequently formed N-type FinFET can be adjusted to the appropriate target NMOS threshold voltage value within a range of greater than or equal to 0.2V but less than or equal to 0.35V. That is, the NMOS threshold voltage value can be stabilized at the respective target NMOS threshold voltage value.

Alternatively, the first work function material layer of the PMOS work function layer is doped with the first ions, and the second work function material layer in the NMOS work function layer is doped with the second ions. Alternatively, the first work function material layer in the PMOS work function layer is doped with the first ions, and the second work function material layer in the PMOS work function layer is doped with the second ions. Alternatively, only the first work function material layer in the PMOS work function layer is doped with the first ions. Alternatively, only the second work function material layer in the PMOS work function layer and the second work function material layer in the NMOS work function layer are doped with the second ions. Alternatively, only the second work function material layer in the NMOS work function layer are doped with the second ions.

Embodiment Three

The present embodiment provides a method of forming a semiconductor structure, similar to the semiconductor structure described in Embodiment One. The difference in that, in the present embodiment, the semiconductor structure is a P-type planar transistors and an N-type planar transistor with the corresponding gate structures connected together.

In this embodiment, the semiconductor substrate also includes the PMOS region and the NMOS region. However, the PMOS region does not have the first fin portion, and the NMOS region does not have the second fin portion. Thus, the bottom of the first gate structure recess exposes the semiconductor substrate in the PMOS region instead of the first fin portion, and the bottom of the second gate structure recess exposes the semiconductor substrate in the NMOS region instead of the second fin portion. Also, the PMOS work function layer is not across the first fin portion, and the NMOS work function layer is not across the second fin portion.

Embodiment Four

The present embodiment provides a semiconductor structure, similar to the semiconductor structure described in Embodiment Two. The difference in that, in the present embodiment, the semiconductor structure is a planar P-type transistors and a planar N-type transistor with the corresponding gate structures connected together.

In this embodiment, the semiconductor substrate also includes the PMOS region and the NMOS region. However, the PMOS region does not have the first fin portion, and the NMOS region does not have the second fin portion. Thus, the bottom of the first gate structure recess exposes the semiconductor substrate in the PMOS region instead of the first fin portion, and the bottom of the second gate structure recess exposes the semiconductor substrate in the NMOS region instead of the second fin portion. Also, the PMOS work function layer is not across the first fin portion, and the NMOS work function layer is not across the second fin portion.

Embodiment Five

Figure 47:
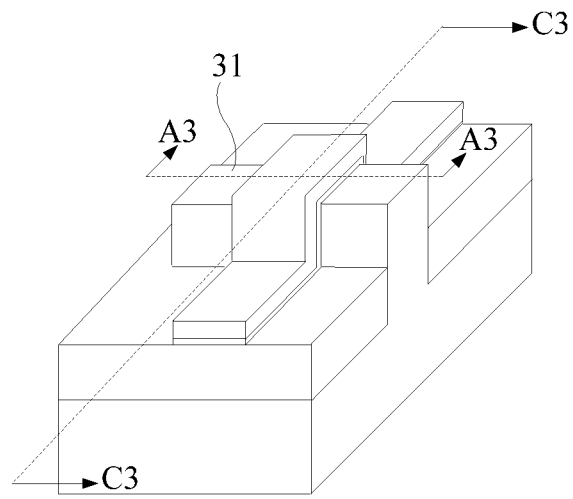
FIG. 47 is a 3D schematic view of another semiconductor substrate with a polysilicon gate structure.
Figure 48:
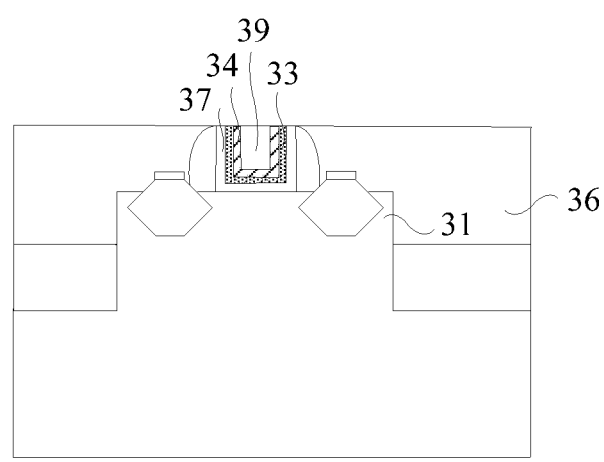
FIG. 48 is a cross-sectional view of a P-type FinFET formed along the A3A3 direction in FIG. 47.
Figure 49:
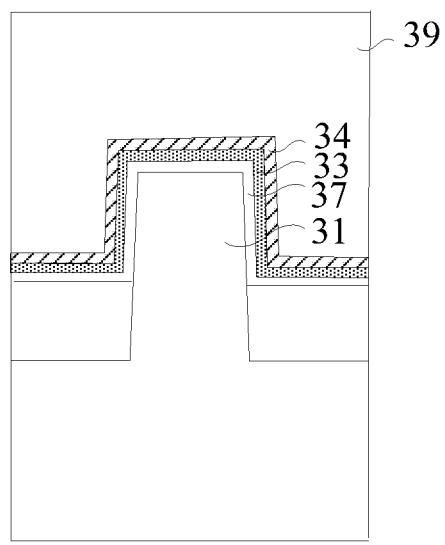
FIG. 49 is a cross-sectional structure of a P-type FinFET formed along the C3C3 direction in FIG. 47.

Referring to FIG. 47 to FIG. 49, and Embodiment One, a method for forming a P-type FinFET is provided. First, a semiconductor substrate is provided, and the semiconductor substrate has a fin portion 31. Further, a dielectric layer 36 is formed on the semiconductor substrate. The dielectric layer 36 contains a gate structure recess, and the bottom of the gate structure recess exposes the fin portion 31.

Further, a stack structure 37 is formed on the dielectric layer, the bottom and sidewalls of the gate structure recess, and the stack structure 37 includes an interface layer (not shown) and a high-k gate dielectric layer (not shown) located on the interface layer. A first work function material layer 33 is formed on the stack structure 37, and the first work function material layer 33 may be made of TiN or TiSiN.

After forming the first work function material layer 33, a first ion implantation is performed on the first work function material layer 33. The first ions of the first ion implantation include at least one of fluorine ions and aluminum ions. Further, a second work function material layer 34 is formed on the first work function material layer 33 after the first ion implantation. The second work function material layer 34 may be made of TiAl or TiCAl.

In certain embodiments, the first implantation dose of first ion implantation is greater than or equal to 1E16 atom/cm³ and not more than 4E16 atom/cm³; and a first implantation energy is greater than or equal to 0.5 KeV and less than or equal to 2 KeV. If the first implantation dose of the first ion implantation is too large, and/or the first implantation energy is too large, too many defects may be introduced, affecting the performance of the first work function material layer.

If the first implantation dose of the first ion implantation is too small, and/or the first implantation energy is too small, after the PMOS threshold voltage value of the subsequently formed P-type FinFET is adjusted to the target PMOS threshold voltage value, the PMOS threshold voltage value may still fluctuate. The difficulty to maintain the total threshold voltage value of the semiconductor structure at the target total threshold voltage value is not substantially reduced.

Further, when the first implantation dose of the first ion implantation is greater than or equal to 1E16 atom/cm³ but less than or equal to 2E16 atom/cm³, the first implantation energy is greater than or equal to 0.5 KeV but less than or equal to 1 KeV, the PMOS threshold voltage value of the subsequently formed P-type FinFET can be adjusted to the appropriate target PMOS threshold voltage value within a range of greater than or equal to 0V but less than or equal to 0.05V. That is, the PMOS threshold voltage value can be stabilized at the respective target PMOS threshold voltage value.

When the first implantation dose of the first ion implantation is greater than or equal to 2E16 atom/cm³ but less than or equal to 4E16 atom/cm³, the first implantation energy is greater than or equal to 1 KeV but less than or equal to 2 KeV, the PMOS threshold voltage value of the subsequently formed P-type FinFET can be adjusted to the appropriate target PMOS threshold voltage value within a range of greater than or equal to 0.05V but less than or equal to 0.1V. That is, the PMOS threshold voltage value can be stabilized at the respective target PMOS threshold voltage value.

Further, after forming the second work function material layer, the second ion implantation is performed on the second work function material layer. The second ions of the second ion implantation include at least one of nitrogen ions and aluminum ions.

In certain embodiments, the second implantation dose of the second ion implantation is greater than or equal to 1E16 atom/cm³ and not more than 4E16 atom/cm³; and a second implantation energy is greater than or equal to 0.4 KeV and less than or equal to 2.5 KeV. If the second implantation dose of the second ion implantation is too large, and/or the second implantation energy is too large, too many defects may be introduced, affecting the performance of the second work function material layer.

If the second implantation dose of the second ion implantation is too small, and/or the second implantation energy is too small, after the NMOS threshold voltage value of the subsequently formed N-type FinFET is adjusted to the target NMOS threshold voltage value, the NMOS threshold voltage value may still fluctuate. The difficulty to maintain the total threshold voltage value of the semiconductor structure at the target total threshold voltage value is not substantially reduced.

In certain embodiments, when the second implantation dose of the second ion implantation is greater than or equal to 1E16 atom/cm³ but less than or equal to 2E16 atom/cm³, the second implantation energy is greater than or equal to 0.4 KeV but less than or equal to 1.5 KeV, the NMOS threshold voltage value of the subsequently formed N-type FinFET can be adjusted to the appropriate target NMOS threshold voltage value within a range of greater than or equal to 0V but less than or equal to 0.2V. That is, the NMOS threshold voltage value can be stabilized at the respective target NMOS threshold voltage value.

When the second implantation dose of the second ion implantation is greater than or equal to 2E16 atom/cm³ but less than or equal to 4E16 atom/cm³, the second implantation energy is greater than or equal to 1.5 KeV but less than or equal to 2.5 KeV, the NMOS threshold voltage value of the subsequently formed N-type FinFET can be adjusted to the appropriate target NMOS threshold voltage value within a range of greater than or equal to 0.2V but less than or equal to 0.35V. That is, the NMOS threshold voltage value can be stabilized at the respective target NMOS threshold voltage value.

Further, a gate material layer may be formed on the second work function material layer 34 after the second ion implantation. Alternatively, only the first ion implantation is formed on the first work function material layer.

The portions of the stack structure 37, the first work function material layer 33, the second work function material layer 34 and the gate material layer that are higher than the dielectric layer are removed. The remaining gate material layer is a gate layer 39, forming a gate structure together with the remaining first work function material layer 33, second work function material layer 34, and stack structure 37. The remaining first work function material layer 33 and remaining second work function material layer 34 stacked together to form the PMOS work function layer.

Embodiment Six

Referring to FIG. 48 and FIG. 49, Embodiments One, Two, and Five, a P-type FinFET is provided. The P-type FinFET includes a semiconductor substrate, and the semiconductor has a fin portion 31. A dielectric layer 36 is located on the semiconductor substrate, and the dielectric layer 36 has a gate structure recess, the bottom of which exposes the fin portion 31. Further, a PMOS work function layer is formed on the bottom and the sidewalls of the gate structure recess, and the PMOS work function layer is across the fin portion, and covers the top and sidewalls of the fin portion.

A gate layer 39 is formed on the PMOS work function layer. The PMOS work function layer is doped with doping ions. The PMOS work function layer is a stack of a first work function material layer 33 (the lower layer) and a second work function material layer 34 (the upper layer). The doping ions in the PMOS work function layer include: first ions doped in the first work function material layer 33 in a first ion implantation, and second ions doped the second work inner function material layer 34 in a second ion implantation. The first ions include at least one of fluoride ions and aluminum ions; and the second ions include at least one of nitrogen ions and aluminum ions.

The first implantation dose of the first ion implantation is greater than or equal to 1E16 atom/cm³ but less than or equal to 2E16 atom/cm³, the first implantation energy is greater than or equal to 0.5 KeV but less than or equal to 1 KeV. Or, the first implantation dose of the first ion implantation is greater than or equal to 2E16 atom/cm³ but less than or equal to 4E16 atom/cm³, the first implantation energy is greater than or equal to 1 KeV but less than or equal to 2 KeV.

The second implantation dose of the second ion implantation is greater than or equal to 1E16 atom/cm³ but less than or equal to 2E16 atom/cm³, the second implantation energy is greater than or equal to 0.4 KeV but less than or equal to 1.5 KeV. Or, the second implantation dose of the second ion implantation is greater than or equal to 2E16 atom/cm3 but less than or equal to 4E16 atom/cm$^3$, the second implantation energy is greater than or equal to 1.5 KeV but less than or equal to 2.5 KeV.

Alternatively, only the first ion implantation performed on the first work function material layer 33, without performing the second ion implantation on the second work function material layer 34.

Embodiment Seven

Referring to Embodiments One, Three, and Five, the present embodiment provides a method for forming a planar PMOS transistor. The difference between the present embodiment and Embodiment Five includes: the semiconductor substrate does not have a fin portion; the bottom of the gate structure recess exposes the semiconductor substrate instead of the fin portion, and the PMOS work function layer is not across the fin portion.

Embodiment Eight

Referring to Embodiments One, Three, Five, Six, and Seven, the present embodiment provides a planar PMOS transistor. The difference between the present embodiment and Embodiment Five includes: the semiconductor substrate does not have a fin portion; the bottom of the gate structure recess exposes the semiconductor substrate instead of the fin portion, and the PMOS work function layer is not across the fin portion.

Embodiment Nine

Figure 50:
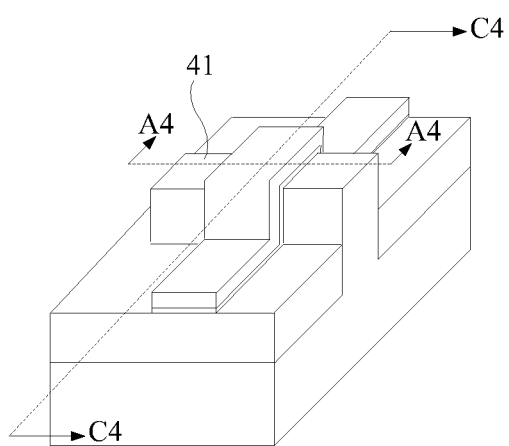
FIG. 50 is a 3D schematic view of another semiconductor substrate with a polysilicon gate structure.
Figure 51:
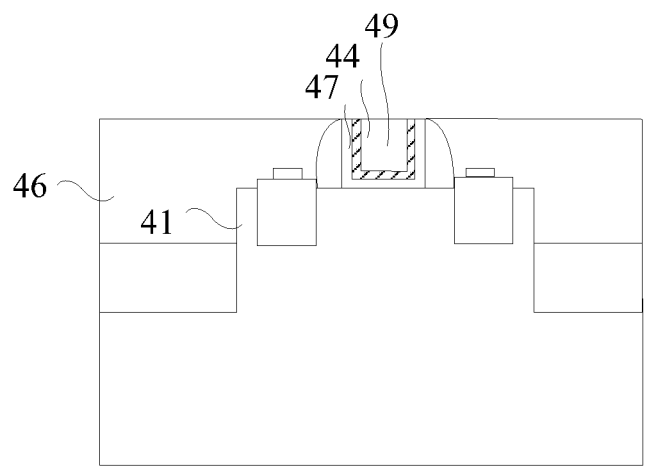
FIG. 51 is a cross-sectional view of an N-type FinFET formed along the A4A4 direction in FIG. 50.
Figure 52:
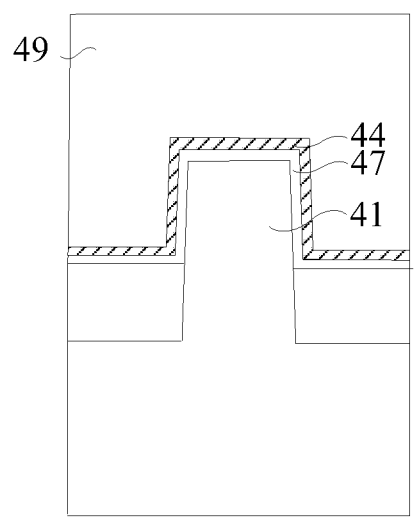
FIG. 52 is a cross-sectional view of an N-type FinFET formed along the C4C4 direction in FIG. 50.

Referring to FIG. 50 to FIG. 52, and Embodiment One, a method for forming a N-type FinFET is provided. First, a semiconductor substrate is provided, and the semiconductor substrate has a fin portion 41. Further, a dielectric layer is formed on the semiconductor substrate. The dielectric layer contains a gate structure recess, and the bottom of the gate structure recess exposes the fin portion 41.

Further, a stack structure 47 is formed on the dielectric layer, the bottom and sidewalls of the gate structure recess, and the stack structure 47 includes an interface layer (not shown) and a high-k gate dielectric layer (not shown) located on the interface layer. A second work function material layer 44 is formed on the stack structure 47, and the second work function material layer 44 may be made of TiAl or TiCAl.

After forming the second work function material layer 44, the second ion implantation is performed on the second work function material layer 44. The second ions of the second ion implantation include at least one of nitrogen ions and aluminum ions.

In certain embodiments, the second implantation dose of the second ion implantation is greater than or equal to 1E16 atom/cm$^3$ and not more than 4E16 atom/cm$^3$; and the second implantation energy is greater than or equal to 0.4 KeV and less than or equal to 2.5 KeV. If the second implantation dose of the second ion implantation is too large, and/or the second implantation energy is too large, too many defects may be introduced, affecting the performance of the second work function material layer.

If the second implantation dose of the second ion implantation is too small, and/or the second implantation energy is too small, after the NMOS threshold voltage value of the subsequently formed N-type FinFET is adjusted to the target NMOS threshold voltage value, the NMOS threshold voltage value may still fluctuate. The difficulty to maintain the total threshold voltage value of the semiconductor structure at the target total threshold voltage value is not substantially reduced.

In certain embodiments, when the second implantation dose of the second ion implantation is greater than or equal to 1E16 atom/cm$^3$ but less than or equal to 2E16 atom/cm$^3$, the second implantation energy is greater than or equal to 0.4 KeV but less than or equal to 1.5 KeV, the NMOS threshold voltage value of the subsequently formed N-type FinFET can be adjusted to the appropriate target NMOS threshold voltage value within a range of greater than or equal to 0V but less than or equal to 0.2V. That is, the NMOS threshold voltage value can be stabilized at the respective target NMOS threshold voltage value.

When the second implantation dose of the second ion implantation is greater than or equal to 2E16 atom/cm$^3$ but less than or equal to 4E16 atom/cm$^3$, the second implantation energy is greater than or equal to 1.5 KeV but less than or equal to 2.5 KeV, the NMOS threshold voltage value of the subsequently formed N-type FinFET can be adjusted to the appropriate target NMOS threshold voltage value within a range of greater than or equal to 0.2V but less than or equal to 0.35V. That is, the NMOS threshold voltage value can be stabilized at the respective target NMOS threshold voltage value.

Further, a gate material layer may be formed on the second work function material layer 44 after the second ion implantation. The portions of the stack structure 47, the second work function material layer 44, and the gate material layer that are higher than the dielectric layer are removed. The remaining gate material layer is a gate layer 49, forming a gate structure together with the remaining second work function material layer 44, and stack structure 47. The remaining second work function material layer 44 forms the NMOS work function layer.

Embodiment Ten

Referring to FIG. 51 to FIG. 52, and Embodiments One and Nine, the present embodiment provides an N-type FinFET. The N-type FinFET includes a semiconductor substrate, and the semiconductor has a fin portion 41. A dielectric layer 46 is located on the semiconductor substrate, and the dielectric layer 46 has a gate structure recess, the bottom of which exposes the fin portion 41. Further, a NMOS work function layer is formed on the bottom and the sidewalls of the gate structure recess, and the NMOS work function layer is across the fin portion, and covers the top and sidewalls of the fin portion 41.

A gate layer 49 is formed on the NMOS work function layer. The NMOS work function layer is doped with doping ions. The NMOS work function layer is the second work function material layer 44. The second work function material layer 44 is doped with the second ions in the second ion implantation. The second ions include at least one of nitrogen ions and aluminum ions.

The second implantation dose of the second ion implantation is greater than or equal to 1E16 atom/cm$^3$ but less than or equal to 2E16 atom/cm$^3$, the second implantation energy is greater than or equal to 0.4 KeV but less than or equal to 1.5 KeV. Or, the second implantation dose of the second ion implantation is greater than or equal to 2E16 atom/cm$^3$ but less than or equal to 4E16 atom/cm$^3$, the second implantation energy is greater than or equal to 1.5 KeV but less than or equal to 2.5 KeV.

Embodiment Eleven

Referring to Embodiments One and Nine, the present embodiment provides a method for forming a planar NMOS transistor. The difference between the present embodiment and Embodiment Nine includes: the semiconductor substrate does not have a fin portion; the bottom of the gate structure recess exposes the semiconductor substrate instead of the fin portion, and the NMOS work function layer is not across the fin portion.

Embodiment Twelve

Referring Embodiments One, Nine, Ten, and Eleven, the present embodiment provides a planar NMOS transistor. The difference between the present embodiment and Embodiment Ten includes: the semiconductor substrate does not have a fin portion; the bottom of the gate structure recess exposes the semiconductor substrate instead of the fin portion, and the NMOS work function layer is not across the fin portion.

The above detailed descriptions only illustrate certain exemplary embodiments of the present invention, and are not intended to limit the scope of the present invention. Those skilled in the art can understand the specification as whole and technical features in the various embodiments can be modified, replaced, and/or combined into other embodiments understandable to those persons of ordinary skill in the art. Any equivalent or modification thereof, without departing from the spirit and principle of the present invention, falls within the true scope of the present invention.

What is claimed is:

1. A method for forming a transistor, comprising:
   providing a semiconductor substrate having a fin portion;
   forming a dielectric layer on the semiconductor substrate, the dielectric layer having a gate structure recess, the gate structure recess exposing the fin portion;
   forming a work function layer on a bottom and sidewalls of the gate structure recess, across the fin portion, and covering top and sidewalls of the fin portion, wherein the sidewalls include a silicon oxide layer on a bottom and a silicon nitride layer on the silicon oxide layer;
   performing an ion implantation on the work function layer; and
   forming a gate layer on the work function layer after the ion implantation,
   wherein when the transistor is an NMOS transistor,
      the work function layer is an NMOS work function layer, the NMOS work function layer includes a work function material layer, and
      the ion implantation on the work function material layer of the NMOS work function layer includes ions, including at least one of nitrogen ions and aluminum ions.

2. The method according to claim 1, wherein
   when the transistor is a PMOS transistor, the work function layer is a PMOS work function layer, the PMOS work function layer being a stacked layer of a first work function material layer and a second work function material layer, from bottom to top.

3. The method according to claim 2, wherein the ion implantation includes:
   a first ion implantation on the first work function material layer using first ions, the first ions including at least one of fluoride ions and aluminum ions.

4. The method according to claim 3, wherein the ion implantation further includes:
   a second ion implantation on the second work function material layer using second ions, the second ions including at least one of nitrogen ions and aluminum ions.

5. The method according to claim 3, wherein:
   a first implantation dose of the first ion implantation is greater than or equal to 1E16 atom/cm$^3$ and less than or equal to 2E16 atom/cm$^3$, and a first implantation energy is greater than or equal to 0.5 KeV and less than or equal to 1 KeV; or
   the first implantation dose of the first ion implantation is greater than or equal to 2E16 atom/cm$^3$ and less than or equal to 4E16 atom/cm$^3$, and the first implantation energy is greater than or equal to 1 KeV and less than or equal to 2 KeV.

6. The method according to claim 1, wherein
   an implantation dose is greater than or equal to 1E16 atom/cm$^3$ and less than or equal to 2E16 atom/cm$^3$, and an implantation energy is greater than or equal to 0.4 KeV and less than or equal to 1.5 KeV; or
   the implantation dose is greater than or equal to 2E16 atom/cm$^3$ and less than or equal to 4E16 atom/cm$^3$, and the implantation energy is greater than or equal to 1 KeV and less than or equal to 2 KeV.

7. The method according to claim 2, wherein:
   the first work function material layer is made of TiSiN or TiN, and
   the second work function material layer is made of TiAl or TiCAl.

8. A transistor, comprising:
   a semiconductor substrate having a fin portion;
   a dielectric layer formed on the semiconductor substrate and sidewall spacers, the dielectric layer having a gate structure recess, the gate structure recess exposing the fin portion;
   a stack structure formed on the dielectric layer, the bottom and sidewalls of the gate structure recess, across the fin portion, and covering top and sidewalls of the fin portion;
   a work function layer formed on the stack structure, the work function layer covering the stack structure; and
   a gate layer formed on the work function layer, wherein the work function layer is doped and saturated with ions by an ion implantation, wherein
      when the transistor is a PMOS transistor,
         the work function layer is a PMOS work function layer, the PMOS work function layer being a stacked layer of a first work function material layer and a second work function material layer, from bottom to top, and
         the first work function material layer is doped with first ions, the first ions including at least one of fluoride ions and aluminum ions.

9. The transistor according to claim 8, wherein
   the second work function material layer is doped with second ions, the second ions including at least one of nitrogen ions and aluminum ions.

10. The transistor according to claim 8, wherein
    when the transistor is an NMOS transistor,
       the work function layer is an NMOS work function layer, the NMOS work function layer includes a work function material layer, and
       the work function material layer of the NMOS work function layer is doped with ions, including at least one of nitrogen ions and aluminum ions.

11. The transistor according to claim 8, wherein
    the first work function material layer is made of TiSiN or TiN, and
    the second work function material layer is made of TiAl or TiCAl.

12. A method of forming a semiconductor structure, comprising:
    providing a semiconductor substrate, the semiconductor substrate having a PMOS region and an NMOS region;
    forming a first dielectric layer on the semiconductor substrate in the PMOS region, the first dielectric layer having a first gate structure recess;

forming a second dielectric layer on the semiconductor substrate in the NMOS region, the second dielectric layer having a second gate structure recess;

forming a PMOS work function layer on a bottom and the sidewalls of the first gate structure recess;

forming an NMOS work function layer on a bottom and the sidewalls of the second gate structure recess;

performing a first ion implantation on the PMOS work function layer and a second ion implantation on the NMOS work function layer, wherein:

a first implantation dose of the first ion implantation is greater than or equal to 1E16 atom/cm$^3$ and less than or equal to 2E16 atom/cm$^3$, and a first implantation energy is greater than or equal to 0.5 KeV and less than or equal to 1 KeV, and the first implantation dose of the first ion implantation is greater than or equal to 2E16 atom/cm$^3$ and less than or equal to 4E16 atom/cm$^3$, and the first implantation energy is greater than or equal to 1 KeV and less than or equal to 2 KeV;

forming a first gate layer on the PMOS work function layer after the first ion implantation; and forming a second gate layer on the NMOS work function layer after the second ion implantation.

13. The method according to claim 12, wherein:
first ions used in the first ion implantation include at least one of fluoride ions and aluminum ions; and
second ions used in the second ion implantation include at least one of nitrogen ions and aluminum ions.

14. The method according to claim 12, wherein:
the PMOS work function layer is a stacked layer of a first work function material layer and a second work function material layer, from bottom to top;
the NMOS work function layer is the second work function material layer;
the first work function material layer is made of TiSiN or TiN;
the second work function material layer is made of TiAl or TiCAl; and
the first ion implantation on the PMOS work function layer is the first ion implantation on the first work function material layer.

15. The method according to claim 14, wherein:
after the first ion implantation, the second ion implantation is performed on at least one of the second work function material layer in the PMOS work function layer and the second work function material layer in the NMOS work function layer.

16. The method according to claim 4, wherein:
a second implantation dose of the second ion implantation is greater than or equal to 1E16 atom/cm$^3$ and less than or equal to 2E16 atom/cm$^3$, and a second implantation energy is greater than or equal to 0.4 KeV and less than or equal to 1.5 KeV; or
the second implantation dose of the second ion implantation is greater than or equal to 2E16 atom/cm$^3$ and less than or equal to 4E16 atom/cm$^3$, and the second implantation energy is greater than or equal to 1 KeV and less than or equal to 2 KeV.

17. The transistor according to claim 10, wherein:
the work function material layer of the NMOS work function layer includes TiAl or TiCAl.

18. The transistor according to claim 12, wherein:
the first work function material layer is made of TiSiN or TiN, and
the second work function material layer is made of TiAl or TiCAl.

19. The method according to claim 12, wherein the sidewalls include a silicon oxide layer on a bottom and a silicon nitride layer on the silicon oxide layer.

20. The method according to claim 12, wherein:
a second implantation dose of the second ion implantation is greater than or equal to 1E16 atom/cm$^3$ and less than or equal to 2E16 atom/cm$^3$, and a second implantation energy is greater than or equal to 0.4 KeV and less than or equal to 1.5 KeV; or
the second implantation dose of the second ion implantation is greater than or equal to 2E16 atom/cm$^3$ and less than or equal to 4E16 atom/cm$^3$, and the second implantation energy is greater than or equal to 1 KeV and less than or equal to 2 KeV.

* * * * *